United States Patent
Nozoe et al.

(10) Patent No.: US 11,692,050 B2
(45) Date of Patent: Jul. 4, 2023

(54) PHOTO-ALIGNMENT COPOLYMER, BINDER COMPOSITION, BINDER LAYER, OPTICAL LAMINATE, AND IMAGE DISPLAY DEVICE

(71) Applicant: FUJIFILM Corporation, Tokyo (JP)

(72) Inventors: Yutaka Nozoe, Kanagawa (JP); Takashi Iizumi, Kanagawa (JP); Soichiro Watanabe, Kanagawa (JP); Hideyuki Nishikawa, Kanagawa (JP); Kazushige Nakagawa, Kanagawa (JP); Kunihiro Atsumi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 135 days.

(21) Appl. No.: 17/331,647

(22) Filed: May 27, 2021

(65) Prior Publication Data
US 2021/0292456 A1  Sep. 23, 2021

Related U.S. Application Data

(63) Continuation of application No. PCT/JP2019/045171, filed on Nov. 19, 2019.

(30) Foreign Application Priority Data

Nov. 28, 2018  (JP) ................. 2018-222267

(51) Int. Cl.
| | |
|---|---|
| *G02B 5/30* | (2006.01) |
| *C08F 220/30* | (2006.01) |
| *C08F 220/32* | (2006.01) |
| *C08F 265/06* | (2006.01) |
| *H10K 50/86* | (2023.01) |

(52) U.S. Cl.
CPC ........ *C08F 220/303* (2020.02); *C08F 220/32* (2013.01); *C08F 265/06* (2013.01); *G02B 5/3016* (2013.01); *C09K 2323/02* (2020.08); *C09K 2323/023* (2020.08); *H10K 50/86* (2023.02)

(58) Field of Classification Search
CPC .. C08F 220/303; C08F 220/32; C08F 265/06; H01L 51/5281; G02B 5/3016; C09K 2323/02; C09K 2323/023
USPC .......................................... 428/1.1, 1.2, 1.23
See application file for complete search history.

(56) References Cited

U.S. PATENT DOCUMENTS

| | | | |
|---|---|---|---|
| 10,620,481 B2 | 4/2020 | Wakita et al. | |
| 2015/0219794 A1 | 8/2015 | Choi et al. | |
| 2020/0004087 A1 | 1/2020 | Nozoe et al. | |
| 2020/0079885 A1 | 3/2020 | Tamura et al. | |
| 2020/0095503 A1 | 5/2020 | Nishikawa et al. | |
| 2021/0063825 A1* | 3/2021 | Nozoe ................. | G02F 1/0136 |

FOREIGN PATENT DOCUMENTS

| | | | | |
|---|---|---|---|---|
| JP | 2015527459 | | 9/2015 | |
| JP | 2017016116 | | 1/2017 | |
| JP | 2017016116 A | * | 1/2017 | ....... G02F 1/133345 |
| WO | 2015199052 | | 12/2015 | |
| WO | 2017069252 | | 4/2017 | |
| WO | 2018173727 | | 9/2018 | |
| WO | 2018216806 | | 11/2018 | |
| WO | 2018216812 | | 11/2018 | |

OTHER PUBLICATIONS

"International Search Report (Form PCT/ISA/210) of PCT/JP2019/045171," dated Jan. 21, 2020, with English translation thereof, pp. 1-6.
"Written Opinion of the International Searching Authority (Form PCT/ISA/237) of PCT/JP2019/045171," dated Jan. 21, 2020, with English translation thereof, pp. 1-16.

* cited by examiner

Primary Examiner — Ruiyun Zhang
(74) Attorney, Agent, or Firm — JCIPRNET

(57) ABSTRACT

An object of the invention is to provide a photo-alignment copolymer capable of improving upper layer coatability after layer formation, a binder composition, a binder layer, an optical laminate, and an image display device. A photo-alignment copolymer according to the embodiment of the invention has a repeating unit A including a photo-alignment group, a repeating unit B including a crosslinkable group which causes a crosslinking reaction by the action of at least one selected from the group consisting of light, heat, an acid, and a base, and a repeating unit C including a cleaving group which decomposes by the action of at least one selected from the group consisting of light, heat, an acid, and a base to produce a polar group, and the repeating unit C has the cleaving group on a side chain, and has a group of atoms which is provided on a side closer to a terminal than the cleaving group on the side chain to be able to unevenly distribute the photo-alignment copolymer on an air interface side.

17 Claims, No Drawings

PHOTO-ALIGNMENT COPOLYMER, BINDER COMPOSITION, BINDER LAYER, OPTICAL LAMINATE, AND IMAGE DISPLAY DEVICE

CROSS-REFERENCE TO RELATED APPLICATIONS

This application is a Continuation of PCT International Application No. PCT/JP2019/045171 filed on Nov. 19, 2019, which claims priority under 35 U.S.C. § 119(a) to Japanese Patent Application No. 2018-222267 filed on Nov. 28, 2018. Each of the above applications is hereby expressly incorporated by reference, in its entirety, into the present application.

BACKGROUND OF THE INVENTION

1. Field of the Invention

The present invention relates to a photo-alignment copolymer, a binder composition, a binder layer, an optical laminate, and an image display device.

2. Description of the Related Art

Optical films such as optical compensation sheets or retardation films are used in various image display devices from the viewpoint of solving image staining or enlarging a view angle.

A stretched birefringence film has been used as an optical film, but in recent years, it has been proposed to use an optically anisotropic layer formed of a liquid crystal compound in place of the stretched birefringence film.

Regarding such an optically anisotropic layer, it has been known that in order to align a liquid crystal compound, an alignment film is provided on a support on which the optically anisotropic layer is to be formed. As the alignment film, a photo-alignment film subjected to a photo-alignment treatment in place of a rubbing treatment has been known.

For example, WO2017/069252A describes a photo-alignment film composition containing a polymer A having a constitutional unit a1 containing a cinnamate group and a low-molecular-weight compound B having a cinnamate group and having a smaller molecular weight than the polymer A ([claim 1]), and describes an aspect in which the polymer A has a constitutional unit a2 containing a cross-linkable group such as an epoxy group and an oxetanyl group ([0024] to [0028]).

WO2018/173727A describes a photo-alignment copolymer having a repeating unit A including a predetermined photo-alignment group and a repeating unit B including a predetermined crosslinkable group, and a photo-alignment film formed of a photo-alignment film composition containing the photo-alignment copolymer ([claim 1], [claim 13]).

SUMMARY OF THE INVENTION

The present inventors have conducted studies on the copolymers described in WO2017/069252A and WO2018/173727A, and found that in the formation of an optically anisotropic layer on the photo-alignment film obtained, the coatability (hereinafter, also referred to as "upper layer coatability") of an optically anisotropic layer composition may deteriorate.

Accordingly, an object of the invention is to provide a photo-alignment copolymer capable of improving upper layer coatability after layer formation, a binder composition, a binder layer, an optical laminate, and an image display device.

As a result of intensive studies for achieving the above object, the inventors have found that in a case where a binder composition containing a copolymer containing, in a predetermined mass ratio, a repeating unit A including a photo-alignment group, a repeating unit B including a crosslinkable group which causes a crosslinking reaction by the action of at least one selected from the group consisting of light, heat, an acid, and a base, and a repeating unit C including a cleaving group which decomposes by the action of at least one selected from the group consisting of light, heat, an acid, and a base to produce a polar group is used, upper layer coatability is improved after layer formation, and completed the invention.

That is, the inventors have found that the object can be achieved with the following configuration.

[1] A photo-alignment copolymer comprising: a repeating unit A including a photo-alignment group;

a repeating unit B including a crosslinkable group which causes a crosslinking reaction by the action of at least one selected from the group consisting of light, heat, an acid, and a base; and a repeating unit C including a cleaving group which decomposes by the action of at least one selected from the group consisting of light, heat, an acid, and a base to produce a polar group, in which the repeating unit C has the cleaving group on a side chain, and has a group of atoms which is provided on a side closer to a terminal than the cleaving group on the side chain to be able to unevenly distribute the photo-alignment copolymer on an air interface side, and a content of each of the repeating units with respect to a total of a content a of the repeating unit A, a content b of the repeating unit B, and a content c of the repeating unit C satisfies Expressions (W1) to (W3) by mass ratio.

$$0.03 \leq a/(a+b+c) \leq 0.75 \quad (W1)$$

$$0.20 \leq b/(a+b+c) \leq 0.90 \quad (W2)$$

$$0.03 \leq c/(a+b+c) \leq 0.70 \quad (W3)$$

[2] The photo-alignment copolymer according to claim [1], in which the content of each of the repeating units with respect to the total of the content a of the repeating unit A, the content b of the repeating unit B, and the content c of the repeating unit C satisfies Expressions (W4) to (W6) by mass ratio.

$$0.03 \leq a/(a+b+c) \leq 0.45 \quad (W4)$$

$$0.45 \leq b/(a+b+c) \leq 0.90 \quad (W5)$$

$$0.03 \leq c/(a+b+c) \leq 0.50 \quad (W6)$$

[3] The photo-alignment copolymer according to claim [1], in which the content of each of the repeating units with respect to the total of the content a of the repeating unit A, the content b of the repeating unit B, and the content c of the repeating unit C satisfies Expressions (W7) to (W9) by mass ratio.

$$0.03 \leq a/(a+b+c) \leq 0.40 \quad (W7)$$

$$0.55 \leq b/(a+b+c) \leq 0.90 \quad (W8)$$

$$0.03 \leq c/(a+b+c) \leq 0.40 \quad (W9)$$

[4] The photo-alignment copolymer according to [1], in which the content of each of the repeating units with respect to the total of the content a of the repeating unit A, the content b of the repeating unit B, and the content c of the repeating unit C satisfies Expressions (W10) to (W12) by mass ratio.

$0.03 \leq a/(a+b+c) \leq 0.20$ (W10)

$0.60 \leq b/(a+b+c) \leq 0.80$ (W11)

$0.15 \leq c/(a+b+c) \leq 0.35$ (W12)

[5] The photo-alignment copolymer according to any one of [1] to [4], in which the repeating unit C has the cleaving group on a side chain, and has a fluorine atom or a silicon atom on a side closer to a terminal than the cleaving group on the side chain.

[6] The photo-alignment copolymer according to any one of [1] to [5], in which the repeating unit C is a repeating unit represented by Formula (C1) or a repeating unit represented by Formula (C2-1) or (C2-2).

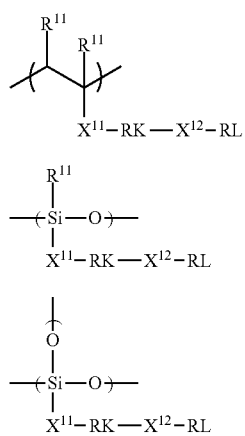

In Formulae (C1) and (C2-1), $R^{11}$ represents a hydrogen atom or an alkyl group having 1 to 3 carbon atoms, and a plurality of $R^{11}$'s in Formula (C1) may be the same as or different from each other.

In Formulae (C1), (C2-1), and (C2-2), $X^{11}$ and $X^{12}$ each independently represent a single bond or a divalent linking group, RK represents the cleaving group, and RL represents a monovalent organic group containing a fluorine atom or a silicon atom.

[7] The photo-alignment copolymer according to [6], in which RK in Formulae (C1), (C2-1), and (C2-2) is a cleaving group represented by any one of Formula (rk-1), ..., or Formula (rk-13).

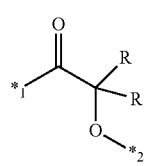
(rk-1)

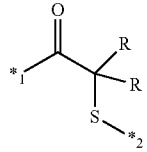
(rk-2)

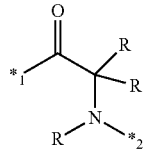
(rk-3)

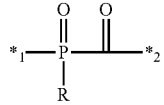
(rk-4)

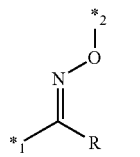
(rk-5)

$*_1$—N=N—$*_2$ (rk-6)

$*_1$—O—O—$*_2$ (rk-7)

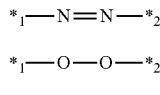
(rk-8)

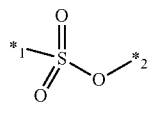
(rk-9)

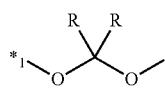
(rk-10)

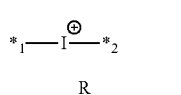
(rk-11)

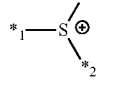
(rk-12)

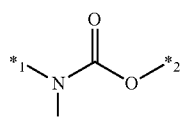
(rk-13)

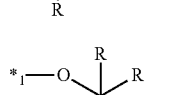

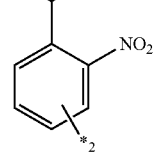

Here, in Formulae (rk-1) to (rk-13), *1 represents a bonding position with any one of $X^{11}$ or $X^{12}$ in Formulae (C1), (C2-1), and (C2-2), *2 represents a bonding position with either $X^{11}$ or $X^{12}$ in Formulae (C1), (C2-1), and (C2-2) not bonded with *1, and R's each independently represent a hydrogen atom or a monovalent organic group.

[8] The photo-alignment copolymer according to any one of [1] to [7], in which the repeating unit A is a repeating unit represented by Formula (A).

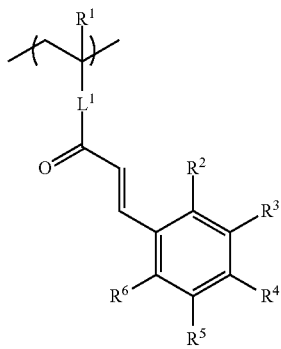
(A)

In Formula (A), $R^1$ represents a hydrogen atom or a methyl group, and $L^1$ represents a divalent linking group. $R^2$, $R^3$, $R^4$, $R^5$, and $R^6$ each independently represent a hydrogen atom or a substituent, and among $R^2$, $R^3$, $R^4$, $R^5$, and $R^6$, two adjacent groups may be bonded to form a ring.

[9] The photo-alignment copolymer according to [8], in which $L^1$ in Formula (A) represents a divalent linking group including a nitrogen atom and a cycloalkane ring, and a part of carbon atoms constituting the cycloalkane ring may be substituted with a hetero atom selected from the group consisting of nitrogen, oxygen, and sulfur.

[10] The photo-alignment copolymer according to [9], in which $L^1$ in Formula (A) is a divalent linking group represented by any one of Formula (1), . . . , or Formula (10).

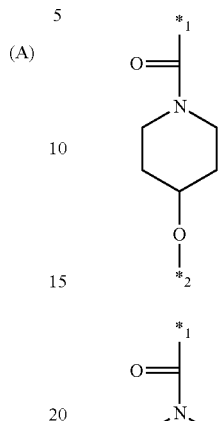
(1)

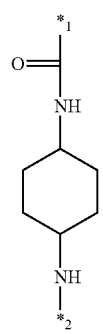
(2)

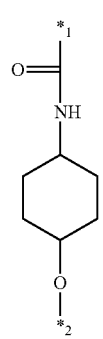

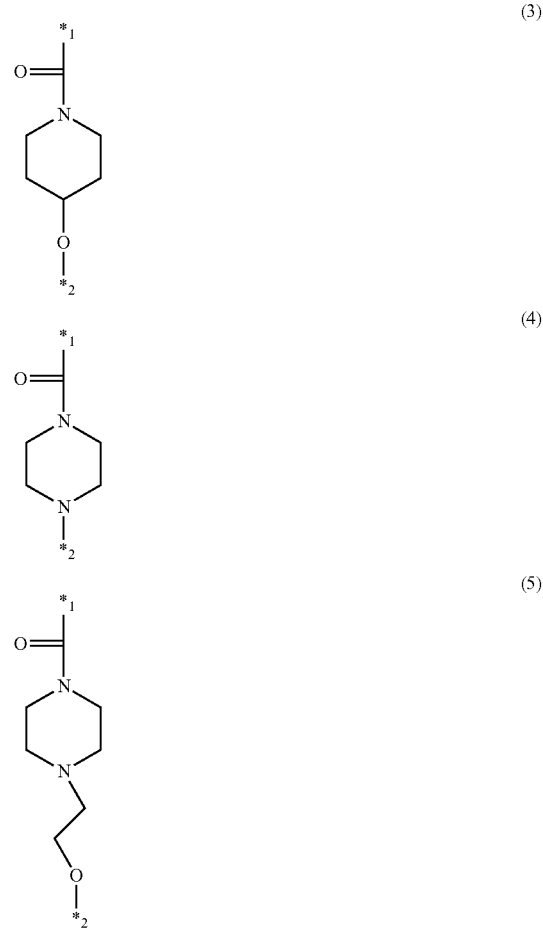
(3)

(4)

(5)

(6)

(7)

(8)

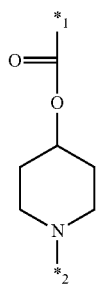

(9)

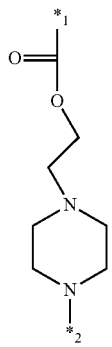

(10)

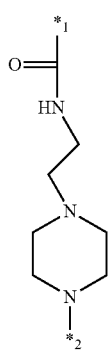

In Formulae (1) to (10), *1 represents a bonding position with a carbon atom constituting a main chain in Formula (A), and *2 represents a bonding position with a carbon atom constituting a carbonyl group in Formula (A).

[11] The photo-alignment copolymer according to [10], in which $L^1$ in Formula (A) is a divalent linking group represented by any one of Formula (2), Formula (3), Formula (7), or Formula (8).

[12] The photo-alignment copolymer according to any one of [8] to [11], in which at least $R^4$ among $R^2$, $R^3$, $R^4$, $R^5$, and $R^6$ in Formula (A) represents a substituent.

[13] The photo-alignment copolymer according to [12], in which $R^2$, $R^3$, $R^5$, and $R^6$ in Formula (A) all represent a hydrogen atom.

[14] The photo-alignment copolymer according to [12] or [13], in which $R^4$ in Formula (A) is an electron-donating substituent.

[15] The photo-alignment copolymer according to [14], in which $R^4$ in Formula (A) is an alkoxy group having 6 to 16 carbon atoms.

[16] The photo-alignment copolymer according to any one of [8] to [15], in which the substituents represented by $R^2$, $R^3$, $R^4$, $R^5$, and $R^6$ in Formula (A) each independently represent a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (11).

(11)

In Formula (11), * represents a bonding position with a benzene ring in Formula (A), and $R^9$ represents a monovalent organic group.

[17] The photo-alignment copolymer according to any one of [1] to [16], in which the repeating unit B is a repeating unit represented by Formula (B).

(B)

In Formula (B), $R^7$ represents a hydrogen atom or a methyl group, $L^2$ represents a divalent linking group, and X represents a crosslinkable group.

[18] The photo-alignment copolymer according to [17], in which X in Formula (B) is at least one crosslinkable group selected from the group consisting of Formulae (X1) to (X4).

(X1)

(X2)

(X3)

(X4)

In Formulae (X1) to (X4), * represents a bonding position with $L^2$ in Formula (B), $R^8$ represents any one of a hydrogen atom, a methyl group, or an ethyl group, and S in Formula (X4) represents a functional group having an ethylenically unsaturated double bond.

[19] The photo-alignment copolymer according to [18], in which the repeating unit B includes a repeating unit in which X in Formula (B) is a crosslinkable group represented by any one of Formula (X1), Formula (X2), or Formula (X3) and a repeating unit in which X in Formula (B) is a crosslinkable group represented by Formula (X4).

[20] The photo-alignment copolymer according to any one of [17] to [19], in which $L^2$ in Formula (B) is a divalent linking group formed by combining at least two selected from the group consisting of a linear, branched, or cyclic alkylene group having 1 to 18 carbon atoms which may have a substituent, an arylene group having 6 to 12 carbon atoms which may have a substituent, an ether group, a carbonyl group, and an imino group which may have a substituent.

[21] The photo-alignment copolymer according to any one of [1] to [20], in which a weight-average molecular weight is 10,000 to 500,000.

[22] The photo-alignment copolymer according to [21], in which the weight-average molecular weight is 30,000 to 300,000.

[23] A binder composition comprising: a binder; and the photo-alignment copolymer according to any one of [1] to [22].

[24] A binder layer which is formed of the binder composition according to [23].

[25] An optical laminate comprising: the binder layer according to [24]; and an optically anisotropic layer which is provided on the binder layer, in which the optically anisotropic layer is formed of a polymerizable liquid crystal composition containing a polymerizable liquid crystal compound, and the binder layer and the optically anisotropic layer are laminated adjacent to each other.

[26] An image display device comprising: the binder layer according to [24]; or the optical laminate according to [25].

According to the invention, it is possible to provide a photo-alignment copolymer capable of improving upper layer coatability after layer formation, a binder composition, a binder layer, an optical laminate, and an image display device.

DESCRIPTION OF THE PREFERRED EMBODIMENTS

Hereinafter, the invention will be described in detail.

The following description of constituent requirements is based on typical embodiments of the invention, but the invention is not limited thereto.

In this specification, a numerical value range expressed using "to" means a range including numerical values before and after "to" as a lower limit value and an upper limit value.

[Photo-Alignment Copolymer]

A photo-alignment copolymer according to the embodiment of the invention has a repeating unit A including a photo-alignment group, a repeating unit B including a crosslinkable group which causes a crosslinking reaction by the action of at least one selected from the group consisting of light, heat, an acid, and a base, and a repeating unit C including a cleaving group which decomposes by the action of at least one selected from the group consisting of light, heat, an acid, and a base to produce a polar group.

In the photo-alignment copolymer according to the embodiment of the invention, the repeating unit C has the cleaving group on a side chain, and has a group of atoms which is provided on a side closer to a terminal than the cleaving group on the side chain to be able to unevenly distribute the photo-alignment copolymer on an air interface side.

In the photo-alignment copolymer according to the embodiment of the invention, a content of each of the repeating units with respect to a total of a content a of the repeating unit A, a content b of the repeating unit B, and a content c of the repeating unit C satisfies Expressions (W1) to (W3) by mass ratio.

$$0.03 \leq a/(a+b+c) \leq 0.75 \tag{W1}$$

$$0.20 \leq b/(a+b+c) \leq 0.90 \tag{W2}$$

$$0.03 \leq c/(a+b+c) \leq 0.70 \tag{W3}$$

In the invention, in a case where a binder composition containing a copolymer containing the above-described repeating units A, B, and C in a predetermined mass ratio is used, upper layer coatability is improved after layer formation.

The details thereof are not clear, but the inventors presume as follows.

That is, it is thought that in a case where after formation of a layer such as a binder layer by the application of a composition containing the photo-alignment copolymer according to the embodiment of the invention, at least one selected from the group consisting of light, heat, an acid, and a base is allowed to act on the photo-alignment copolymer according to the embodiment of the invention unevenly distributed on the air interface side, the cleaving group included on the side chain decomposes to produce a polar group, and thus the upper layer coatability is improved.

Hereinafter, the repeating units A, B, and C will be described in detail.

[Repeating Unit A]

The repeating unit A of the photo-alignment copolymer according to the embodiment of the invention includes a photo-alignment group.

Here, the "photo-alignment group" refers to a group having a photo-alignment function in which rearrangement or an anisotropic chemical reaction is induced by irradiation with light having anisotropy (for example, plane-polarized light). For excellent alignment uniformity and improved thermal stability and chemical stability, a photo-alignment group in which at least one of dimerization or isomerization is caused by the action of light is preferable.

Specific suitable examples of the photo-alignment group which is dimerized by the action of light include groups having a skeleton of at least one type of derivative selected from the group consisting of cinnamic acid derivatives (M. Schadt et al., J. Appl. Phys., vol. 31, No. 7, page 2155 (1992)), coumarin derivatives (M. Schadt et al., Nature., vol. 381, page 212 (1996)), chalcone derivatives (Toshihiro Ogawa et al., Preprints of Symposium on Liquid Crystals (Ekisho Toronkai Koen Yokoshu in Japanese), 2AB03 (1997)), maleimide derivatives, and benzophenone derivatives (Y. K. Jang et al., SID Int. Symposium Digest, P-53 (1997)).

Specific suitable examples of the photo-alignment group which is isomerized by the action of light include groups having a skeleton of at least one type of compound selected from the group consisting of azobenzene compounds (K. Ichimura et al., Mol. Cryst. Liq. Cryst., 298, 221 (1997)), stilbene compounds. (J. G. Victor and J. M. Torkelson, Macromolecules, 20, 2241 (1987)), spiropyran compounds (K. Ichimura et al., Chemistry Letters, page 1063 (1992); K. Ichimura et al., Thin Solid Films, vol. 235, page 101 (1993)), cinnamic acid compounds (K. Ichimura et al., Macromolecules, 30, 903 (1997)), and hydrazono-β-ketoester compounds (S. Yamamura et al., Liquid Crystals, vol. 13, No. 2, page 189 (1993)).

Among these, as the photo-alignment group, a group having a skeleton of at least one type of derivative selected from the group consisting of cinnamic acid derivatives, coumarin derivatives, chalcone derivatives, maleimide derivatives, azobenzene compounds, stilbene compounds, and spiropyran compounds is preferable, and a group having a skeleton of a cinnamic acid derivative or a coumarin derivative is more preferable.

In the invention, the repeating unit A is preferably a repeating unit represented by Formula (A).

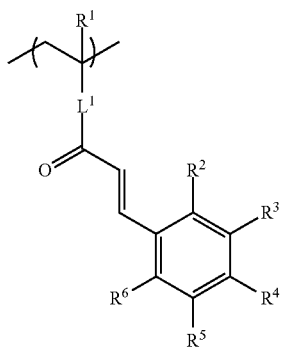

(A)

In Formula (A), $R^1$ represents a hydrogen atom or a methyl group, and $L^1$ represents a divalent linking group. $R^2$, $R^3$, $R^4$, $R^5$, and $R^6$ each independently represent a hydrogen atom or a substituent, and among $R^2$, $R^3$, $R^4$, $R^5$, and $R^6$, two adjacent groups may be bonded to form a ring.

Next, the divalent linking group represented by $L^1$ in Formula (A) will be described.

Here, examples of the divalent linking group are the same as those described with regard to $L^2$ in Formula (B) to be described later, and a divalent linking group containing a nitrogen atom and a cycloalkane ring is preferable since after formation of a layer such as a binder layer by the application of a composition containing the photo-alignment copolymer according to the embodiment of the invention, aligning properties (hereinafter, also referred to as "liquid crystal aligning properties") of an optically anisotropic layer to be formed of a liquid crystal compound on the layer formed are improved. In the invention, as described above, a part of carbon atoms constituting the cycloalkane ring may be substituted with a hetero atom selected from the group consisting of nitrogen, oxygen, and sulfur. In addition, in a case where a part of carbon atoms constituting the cycloalkane ring is substituted with a nitrogen atom, no nitrogen atom may be contained separately from the cycloalkane ring.

The cycloalkane ring is preferably a cycloalkane ring having 6 or more carbon atoms, and specific examples thereof include a cyclohexane ring, a cycloheptane ring, a cyclooctane ring, a cyclododecane ring, and a cyclodocosane ring.

In the invention, $L^1$ in Formula (A) is preferably a divalent linking group represented by any one of Formula (1), . . . , or Formula (10) since the liquid crystal aligning properties are improved.

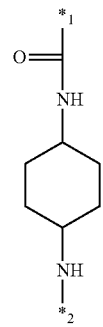

(1)

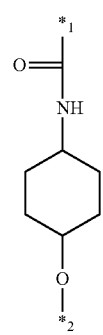

(2)

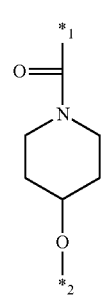

(3)

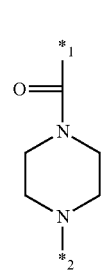

(4)

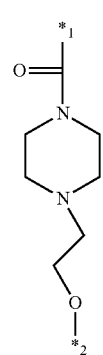

(5)

(6) 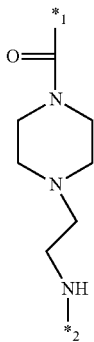

(7) 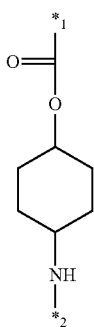

(8) 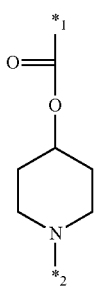

(9) 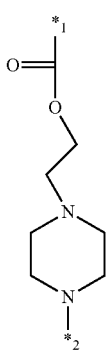

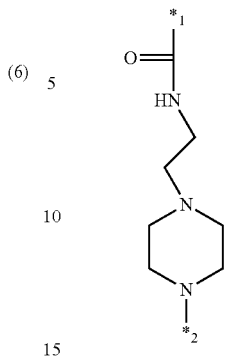 (10)

In Formulae (1) to (10), *1 represents a bonding position with a carbon atom constituting a main chain in Formula (A), and *2 represents a bonding position with a carbon atom constituting a carbonyl group in Formula (A).

Among the divalent linking groups each represented by any one of Formula (1), . . . , or Formula (10), a divalent linking group represented by any one of Formula (2), Formula (3), Formula (7), or Formula (8) is preferable since the balance between the solubility in a solvent to be used during the formation of a layer such as a binder layer and the solvent resistance of the layer obtained is improved.

Next, substituents represented by an aspect of $R^2$, $R^3$, $R^4$, $R^5$, and $R^6$ in Formula (A) will be described. As described above, $R^2$, $R^3$, $R^4$, $R^5$, and $R^6$ in Formula (A) may be hydrogen atoms instead of substituents.

Since the photo-alignment group is easy to interact with the liquid crystal compound, and the liquid crystal aligning properties are thus improved, the substituents represented by an aspect of $R^2$, $R^3$, $R^4$, $R^5$, and $R^6$ in Formula (A) each independently preferably represent a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (11).

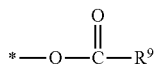 (11)

Here, in Formula (11), * represents a bonding position with a benzene ring in Formula (A), and $R^9$ represents a monovalent organic group.

Examples of the halogen atom include a fluorine atom, a chlorine atom, a bromine atom, and an iodine atom. Among these, a fluorine atom and a chlorine atom are preferable.

Regarding the linear, branched, or cyclic alkyl group having 1 to 20 carbon atoms, the linear alkyl group is preferably an alkyl group having 1 to 6 carbon atoms. Specific examples thereof include a methyl group, an ethyl group, and an n-propyl group.

The branched alkyl group is preferably an alkyl group having 3 to 6 carbon atoms, and specific examples thereof include an isopropyl group and a tert-butyl group.

The cyclic alkyl group is preferably an alkyl group having 3 to 6 carbon atoms, and specific examples thereof include a cyclopropyl group, a cyclopentyl group, and a cyclohexyl group.

The linear halogenated alkyl group having 1 to 20 carbon atoms is preferably a fluoroalkyl group having 1 to 4 carbon atoms, and specific examples thereof include a trifluoromethyl group, a perfluoroethyl group, a perfluoropropyl group, and a perfluorobutyl group. Among these, a trifluoromethyl group is preferable.

The alkoxy group having 1 to 20 carbon atoms is preferably an alkoxy group having 1 to 18 carbon atoms, more preferably an alkoxy group having 6 to 18 carbon atoms, and even more preferably an alkoxy group having 6 to 14 carbon atoms. Specifically, suitable examples thereof include a methoxy group, an ethoxy group, an n-butoxy group, a methoxyethoxy group, an n-hexyloxy group, an n-octyloxy group, an n-decyloxy group, an n-dodecyloxy group, and an n-tetradecyloxy group, and an n-hexyloxy group, an n-octyloxy group, an n-decyloxy group, an n-dodecyloxy group, and an n-tetradecyloxy group are more preferable.

The aryl group having 6 to 20 carbon atoms is preferably an aryl group having 6 to 12 carbon atoms, and specific examples thereof include a phenyl group, an α-methylphenyl group, and a naphthyl group. Among these, a phenyl group is preferable.

The aryloxy group having 6 to 20 carbon atoms is preferably an aryloxy group having 6 to 12 carbon atoms, and specific examples thereof include a phenyloxy group and a 2-naphthyloxy group. Among these, a phenyloxy group is preferable.

Examples of the amino group include: primary amino groups ($-NH_2$); secondary amino groups such as a methylamino group; and tertiary amino groups such as a dimethylamino group, a diethylamino group, a dibenzylamino group, and a group having a nitrogen atom of a nitrogen-containing heterocyclic compound (for example, pyrrolidine, piperidine, and piperazine) as a bond.

Regarding the group represented by Formula (11), examples of the monovalent organic group represented by $R^9$ in Formula (11) include a linear or cyclic alkyl group having 1 to 20 carbon atoms.

The linear alkyl group is preferably an alkyl group having 1 to 6 carbon atoms, and specific examples thereof include a methyl group, an ethyl group, and an n-propyl group. Among these, a methyl group or an ethyl group is preferable.

The cyclic alkyl group is preferably an alkyl group having 3 to 6 carbon atoms, and specific examples thereof include a cyclopropyl group, a cyclopentyl group, and a cyclohexyl group. Among these, a cyclohexyl group is preferable.

The monovalent organic group represented by $R^9$ in Formula (11) may be obtained by combining the linear alkyl group and the cyclic alkyl group described above directly or via a single bond.

In the invention, since the photo-alignment group is easy to interact with the liquid crystal compound, and the liquid crystal aligning properties are thus improved, at least $R^4$ among $R^2$, $R^3$, $R^4$, $R^5$, and $R^6$ in Formula (A) preferably represents the above-described substituent. Moreover, since the linearity of a photo-alignment copolymer to be obtained is improved, the interaction with the liquid crystal compound is made easier, and the liquid crystal aligning properties are thus improved, it is more preferable that $R^2$, $R^3$, $R^5$, and $R^6$ all represent a hydrogen atom.

In the invention, $R^4$ in Formula (A) is preferably an electron-donating substituent since the reaction efficiency is improved in a case where light irradiation is performed on a layer such as a binder layer obtained.

Here, the electron-donating substituent (electron-donating group) refers to a substituent having a Hammett value (Hammett substituent constant σp) of 0 or less, and an alkyl group, a halogenated alkyl group, an alkoxy group, and the like are exemplified among the above-described substituents.

Among these, an alkoxy group is preferable. Since it is possible to suppress film thickness unevenness (hereinafter, also referred to as "wind unevenness") occurring by drying air during drying in the formation of a layer such as a binder layer, and the liquid crystal aligning properties are improved, an alkoxy group having 6 to 16 carbon atoms is more preferable, and an alkoxy group having 7 to 10 carbon atoms is even more preferable.

Specific examples of the repeating unit A represented by Formula (A) include the following repeating units A-1 to A-56. In the following formulae, Me represents a methyl group and Et represents an ethyl group. In the following specific examples, the "1,4-cyclohexyl group" contained in the divalent linking group of the repeating units A-1 to A-10 may be either a cis-form or a trans-form, and is preferably a trans-form.

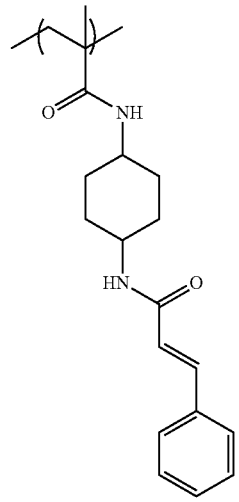

A-1

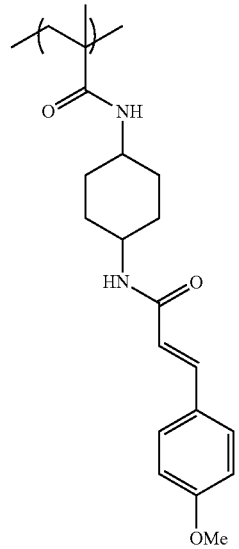

A-2

A-3
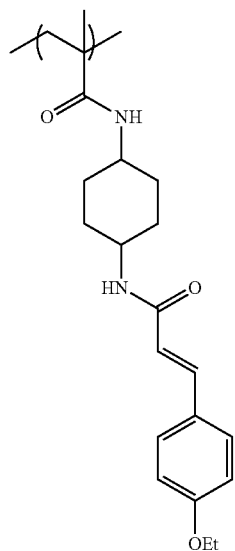
A-4
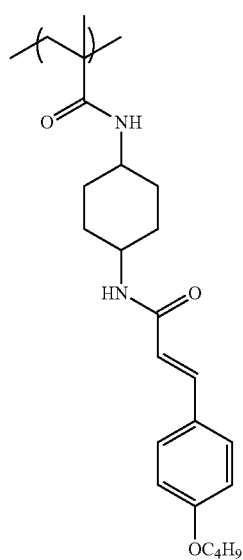
A-5
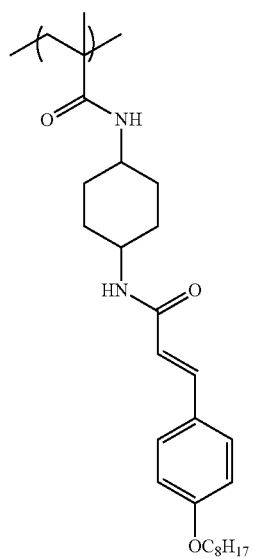
A-6
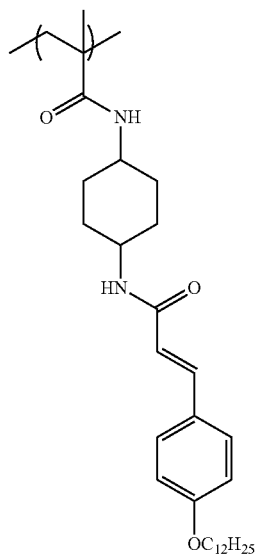
A-7
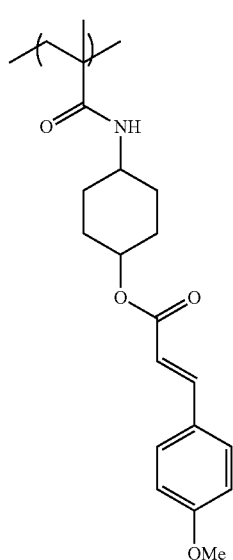
A-8
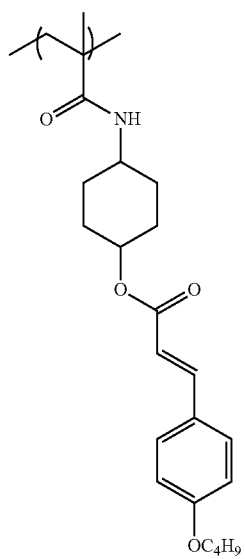

A-9
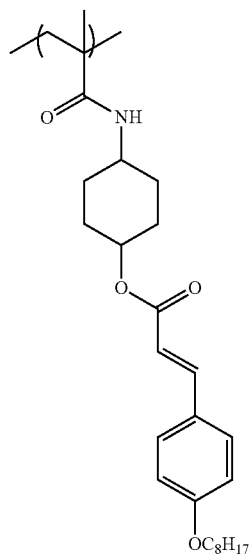
A-10
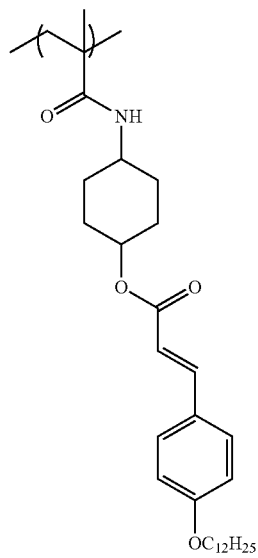
A-11
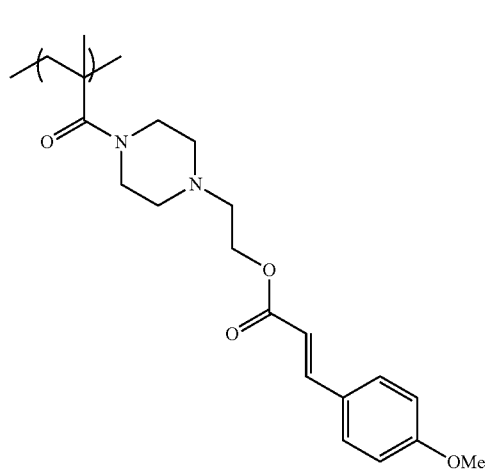
A-12
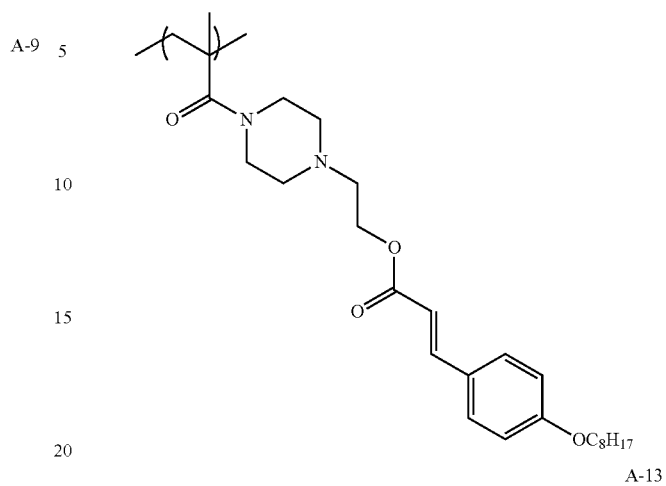
A-13
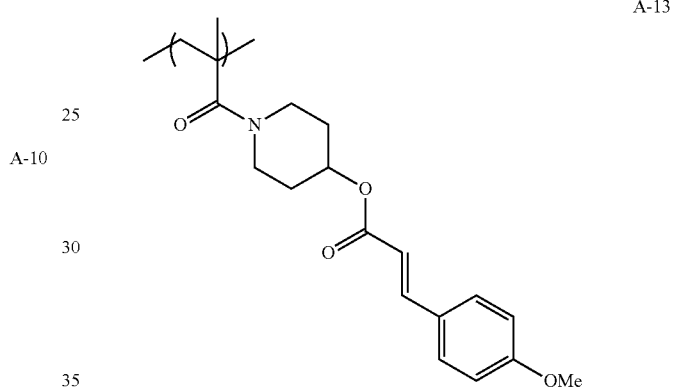
A-14
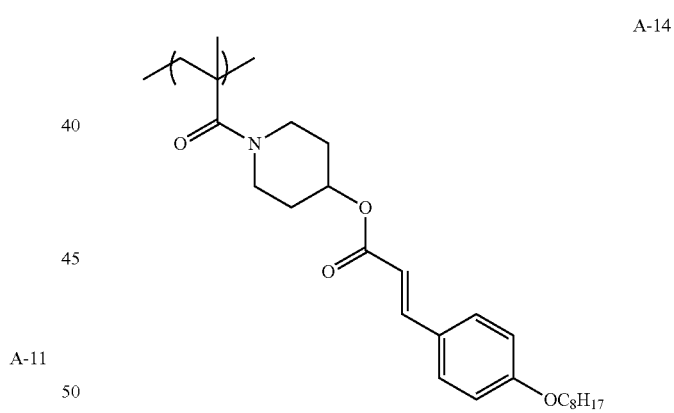
A-15
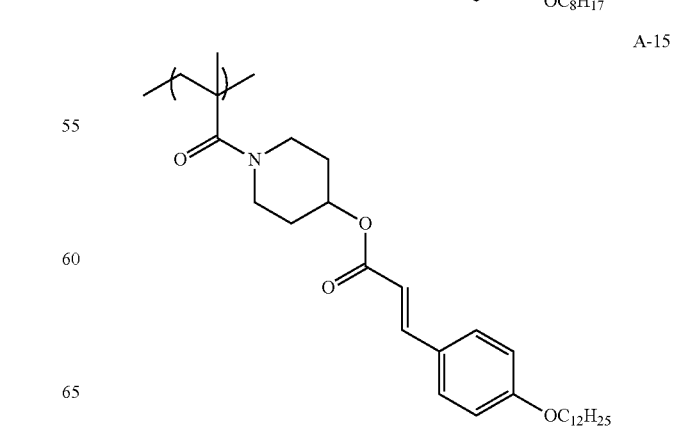

A-16
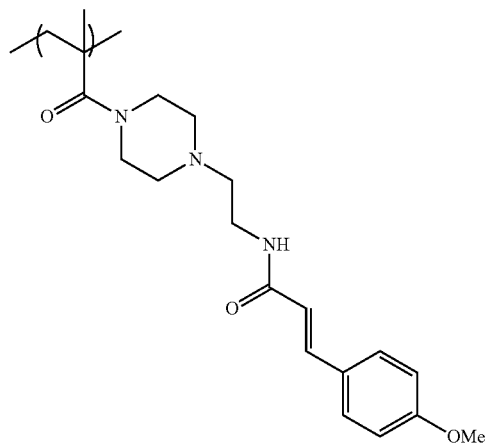
A-17
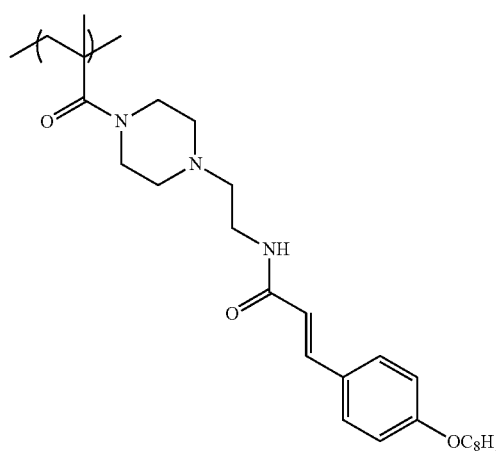
A-18
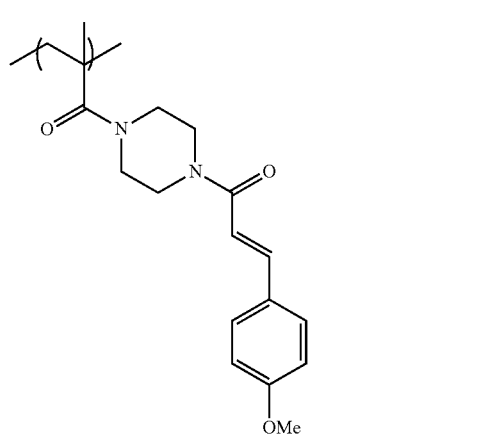
A-19
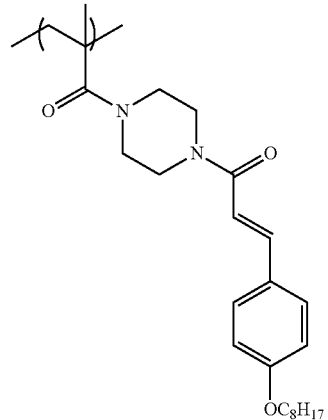
A-20
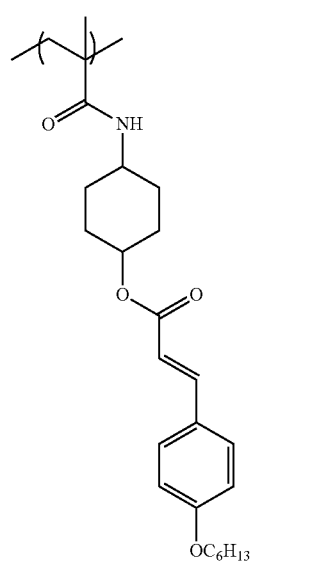
A-21
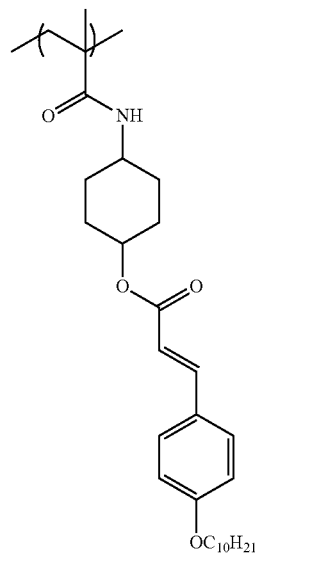

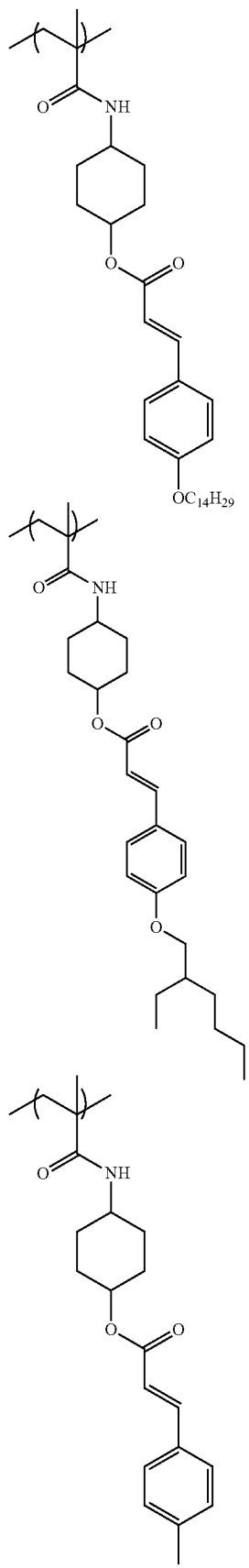
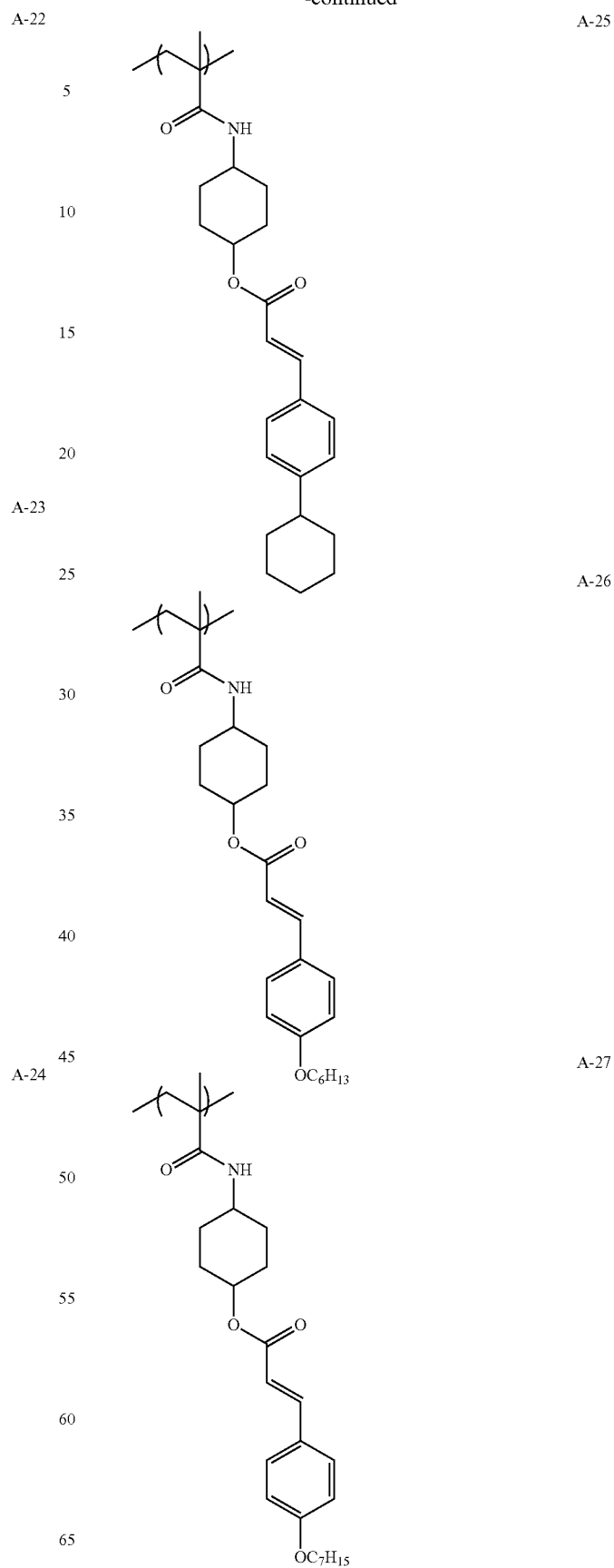

A-28
A-29
A-30
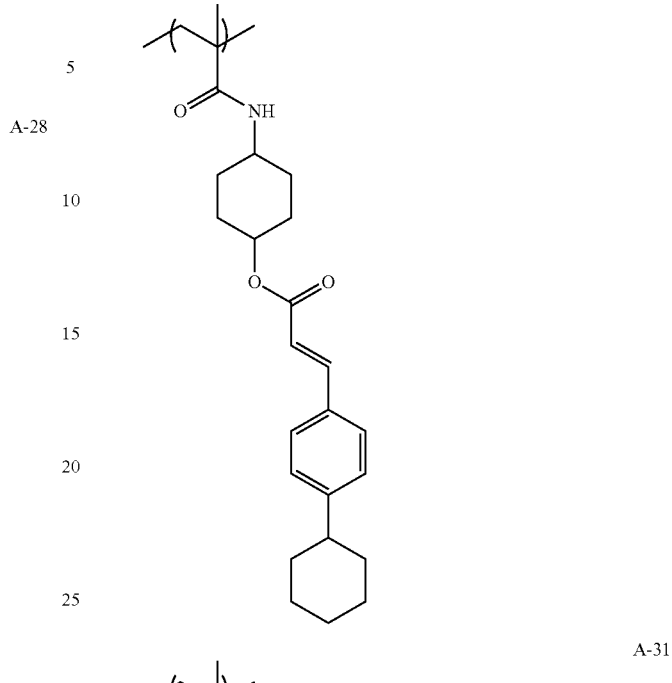
A-31
A-32
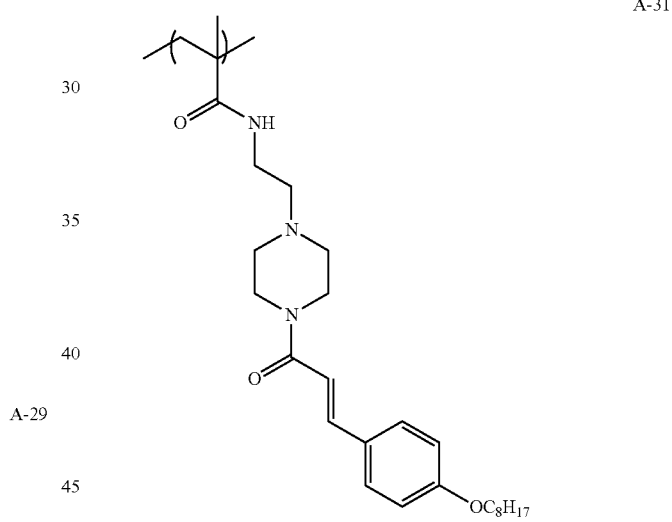
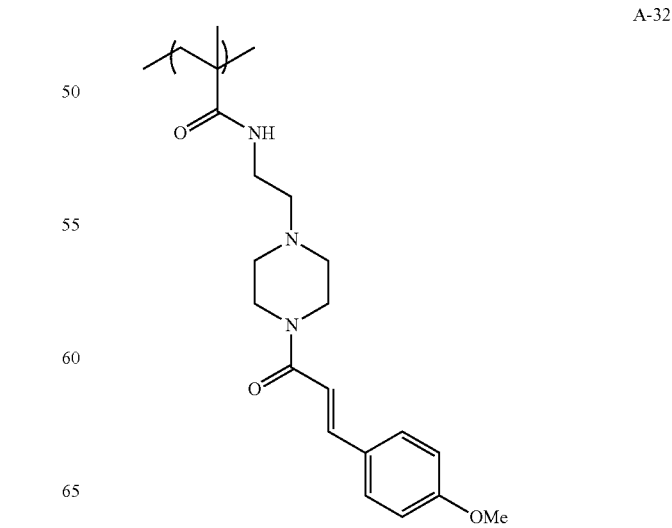

A-33
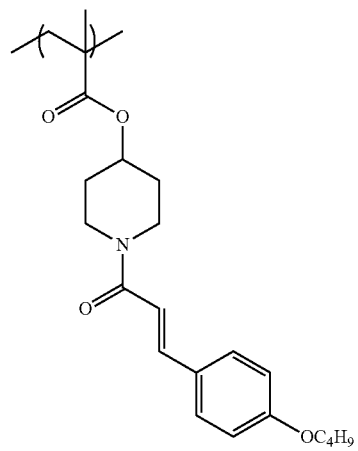
A-34
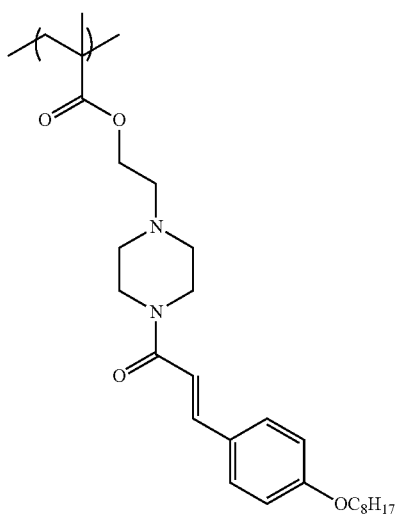
A-35
A-36
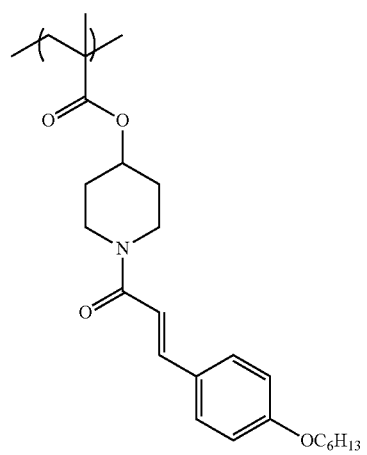
A-37
A-38
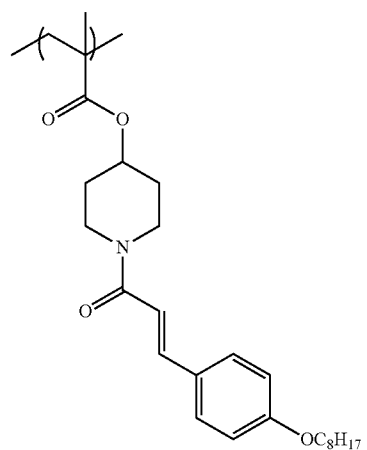

A-39
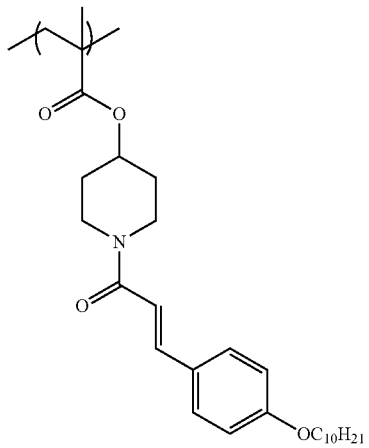
A-40
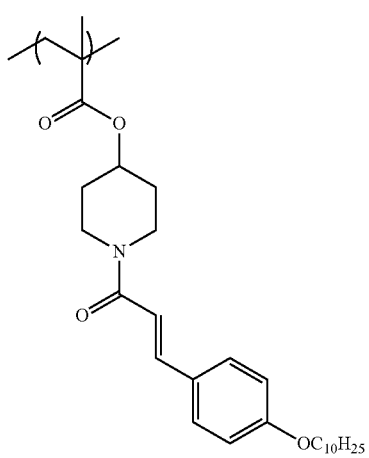
A-41
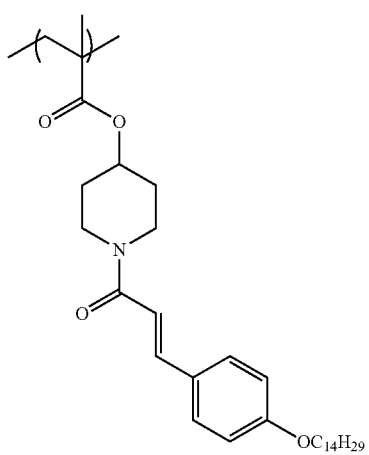
A-42
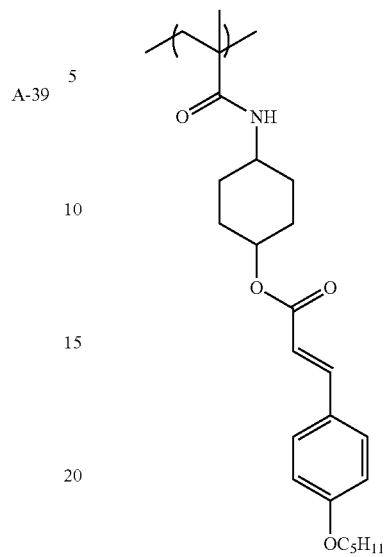
A-43
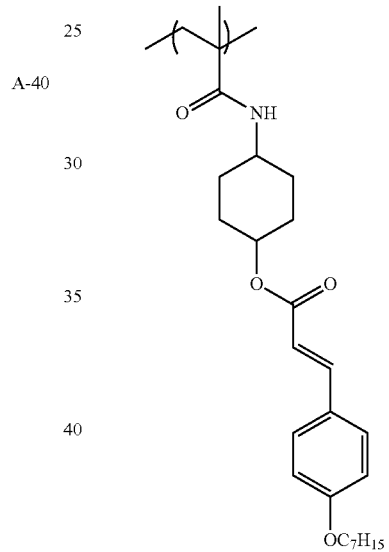
A-44
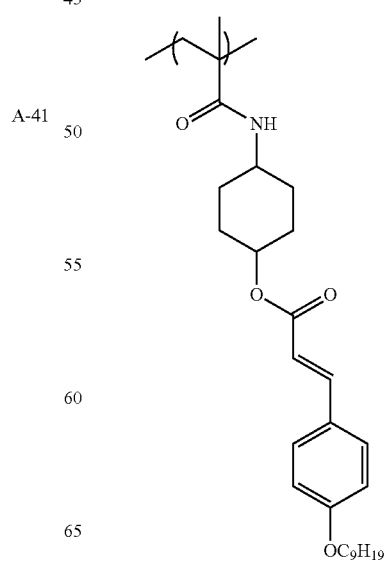

A-45
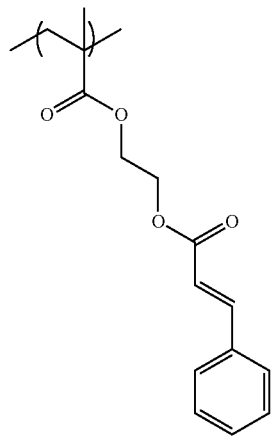
A-46
A-47
A-48
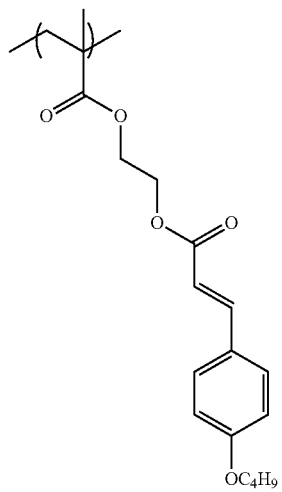
A-49
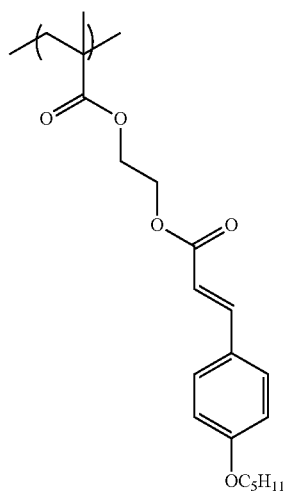
A-50
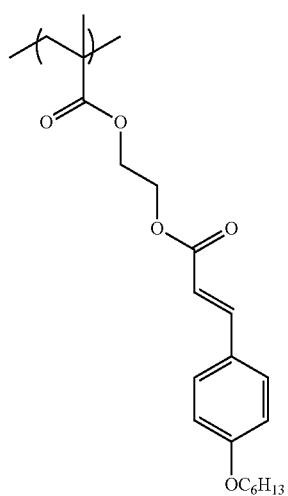

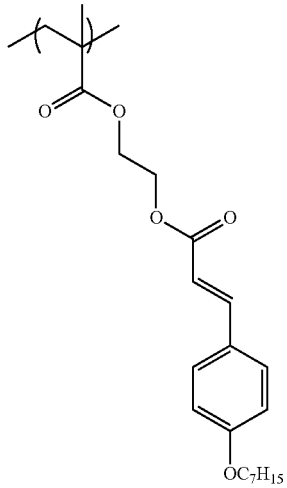
A-51
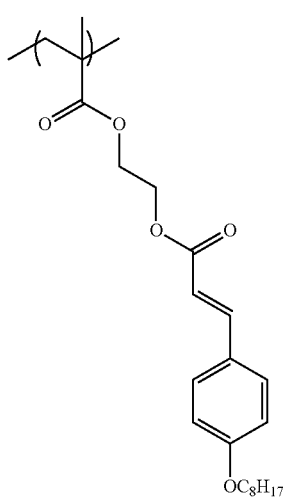
A-52
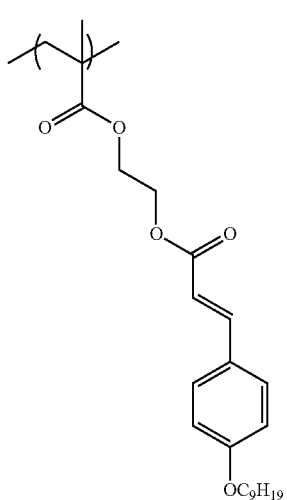
A-53
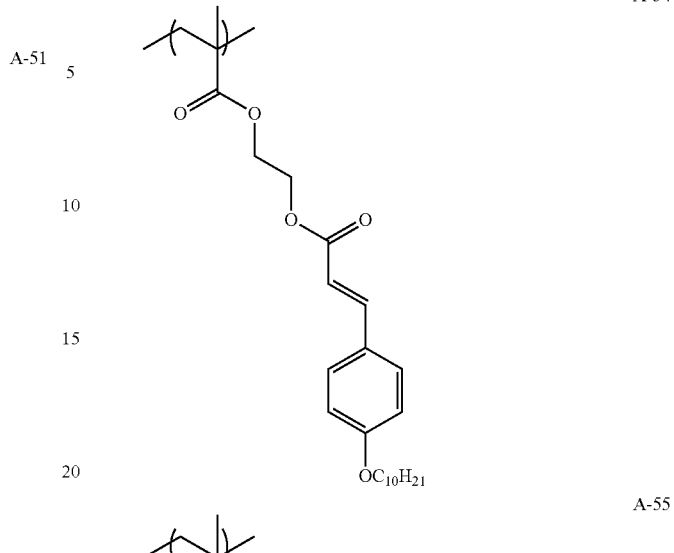
A-54
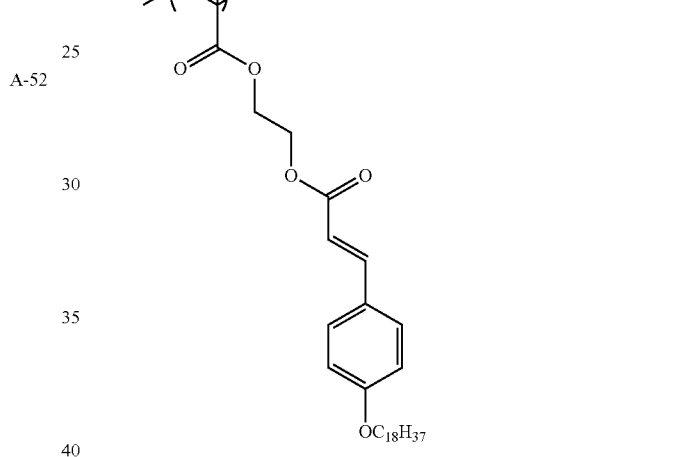
A-55
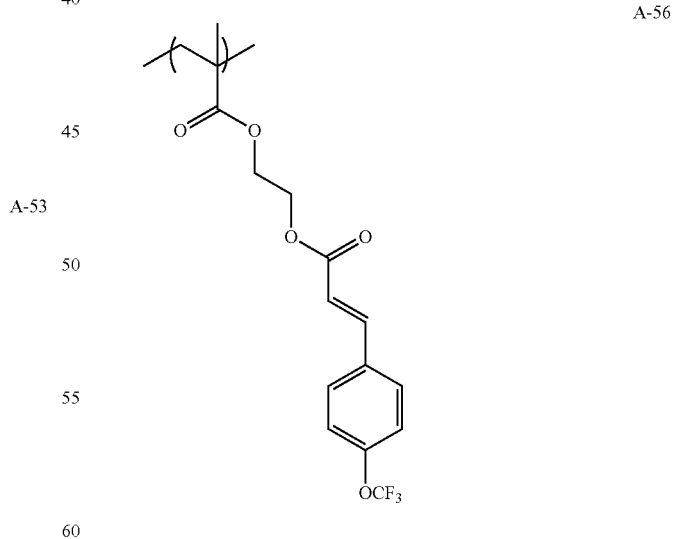
A-56
[Repeating Unit B]
The repeating unit B of the photo-alignment copolymer according to the embodiment of the invention includes a crosslinkable group which causes a crosslinking reaction by the action of at least one selected from the group consisting of light, heat, an acid, and a base.

In the invention, since the liquid crystal aligning properties are improved, the repeating unit B is preferably a repeating unit represented by Formula (B).

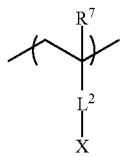

(B)

In Formula (B), R⁷ represents a hydrogen atom or a methyl group, L² represents a divalent linking group, and X represents a crosslinkable group.

Next, the divalent linking group represented by L² in Formula (B) will be described.

Since the photo-alignment group is easy to interact with the liquid crystal compound, and the liquid crystal aligning properties are thus improved, the divalent linking group is preferably a divalent linking group formed by combining at least two selected from the group consisting of a linear, branched, or cyclic alkylene group having 1 to 18 carbon atoms which may have a substituent, an arylene group having 6 to 12 carbon atoms which may have a substituent, an ether group (—O—), a carbonyl group (—C(=O)—), and an imino group (—NH—) which may have a substituent.

Here, examples of the substituent that the alkylene group, the arylene group, and the imino group may have include a halogen atom, an alkyl group, an alkoxy group, an aryl group, an aryloxy group, a cyano group, a carboxy group, an alkoxycarbonyl group, and a hydroxyl group.

Examples of the halogen atom include a fluorine atom, a chlorine atom, a bromine atom, and an iodine atom. Among these, a fluorine atom and a chlorine atom are preferable.

The alkyl group is, for example, preferably a linear, branched, or cyclic alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, a cyclohexyl group, and the like), even more preferably an alkyl group having 1 to 4 carbon atoms, and particularly preferably a methyl group or an ethyl group.

The alkoxy group is, for example, preferably an alkoxy group having 1 to 18 carbon atoms, more preferably an alkoxy group having 1 to 8 carbon atoms (for example, a methoxy group, an ethoxy group, an n-butoxy group, a methoxyethoxy group, and the like), even more preferably an alkoxy group having 1 to 4 carbon atoms, and particularly preferably a methoxy group or an ethoxy group.

Examples of the aryl group include an aryl group having 6 to 12 carbon atoms. Specific examples thereof include a phenyl group, an α-methylphenyl group, and a naphthyl group. Among these, a phenyl group is preferable.

Examples of the aryloxy group include phenoxy, naphthoxy, imidazolyloxy, benzimidazolyloxy, pyridin-4-yloxy, pyrimidinyloxy, quinazolinyloxy, purinyloxy, and thiophen-3-yloxy.

Examples of the alkoxycarbonyl group include methoxycarbonyl and ethoxycarbonyl.

The linear, branched, or cyclic alkylene group having 1 to 18 carbon atoms is preferably a linear alkylene group having 1 to 6 carbon atoms, a branched alkylene group having 3 to 6 carbon atoms, or a cyclic alkylene group having 3 to 6 carbon atoms, and more preferably a linear alkylene group having 1 to 6 carbon atoms. Specific examples of the linear alkylene group include a methylene group, an ethylene group, a propylene group, a butylene group, a pentylene group, a hexylene group, a decylene group, an undecylene group, a dodecylene group, a tridecylene group, a tetradecylene group, a pentadecylene group, a hexadecylene group, a heptadecylene group, and an octadecylene group.

Specific examples of the branched alkylene group include a dimethylmethylene group, a methylethylene group, a 2,2-dimethylpropylene group, and a 2-ethyl-2-methylpropylene group.

Specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group. Among these, a cyclohexylene group is preferable.

Specific examples of the arylene group having 6 to 12 carbon atoms include a phenylene group, a xylylene group, a biphenylene group, a naphthylene group, and a 2,2'-methylenebisphenyl group. Among these, a phenylene group is preferable.

Next, the crosslinkable group represented by X in Formula (B) will be described.

Specific examples of X (crosslinkable group) in Formula (B) include an epoxy group, an epoxycyclohexyl group, an oxetanyl group, and a functional group having an ethylenically unsaturated double bond. Among these, at least one crosslinkable group selected from the group consisting of Formulae (X1) to (X4) is preferable.

(X1)

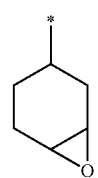

(X2)

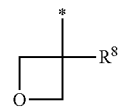

(X3)

(X4)

In Formulae (X1) to (X4), * represents a bonding position with L² in Formula (B), R⁸ represents any one of a hydrogen atom, a methyl group, or an ethyl group, and S in Formula (X4) represents a functional group having an ethylenically unsaturated double bond.

Here, specific examples of the functional group having an ethylenically unsaturated double bond include a vinyl group, an allyl group, a styryl group, an acryloyl group, and a methacryloyl group, and an acryloyl group or a methacryloyl group is preferable.

In the invention, the repeating unit B preferably includes a repeating unit in which X in Formula (B) is a crosslinkable group represented by any one of Formula (X1), Formula (X2), or Formula (X3) (hereinafter, also abbreviated as "repeating unit B1") and a repeating unit in which X in Formula (B) is a crosslinkable group represented by Formula (X4) (hereinafter, also abbreviated as "repeating unit B2") since the strength of an optical laminate according to the embodiment of the invention to be described later is increased and handleability during the formation of other layers using the optical laminate according to the embodiment of the invention to be described later is thus improved.

Specific examples of the repeating unit B (repeating unit B1) represented by Formula (B) include the following repeating units B-1 to B-17.

B-1
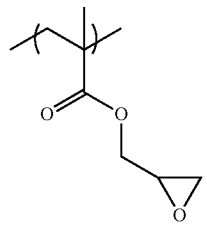

B-2
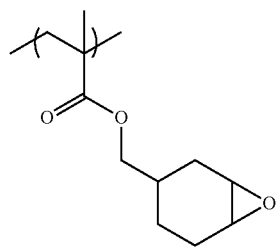

B-3
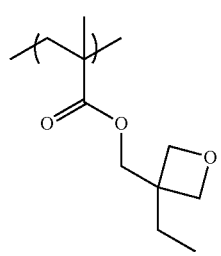

B-4
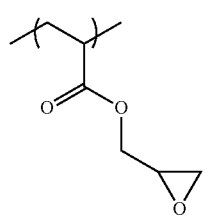

B-5
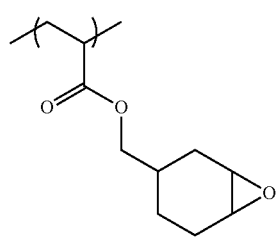

B-6
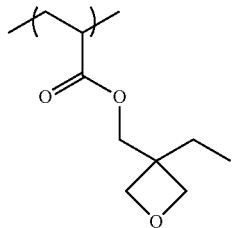

B-7
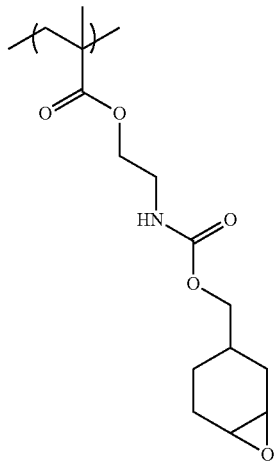

B-8
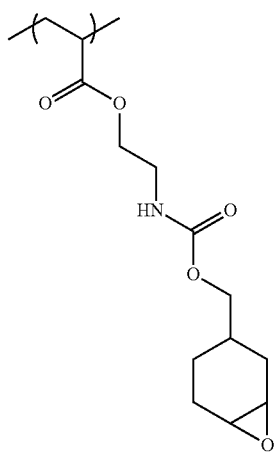

B-9
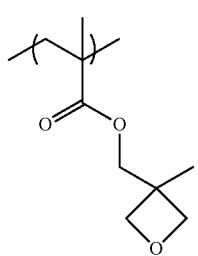

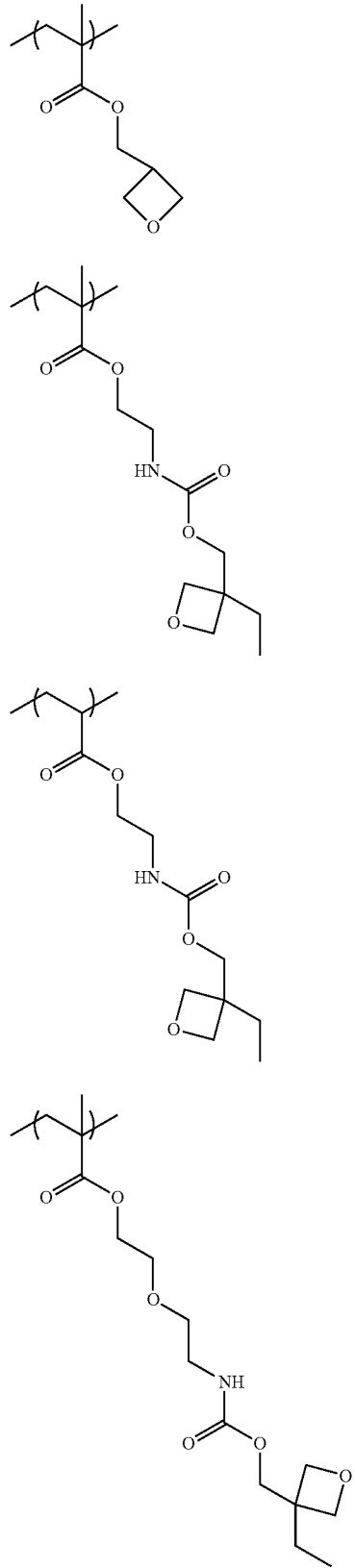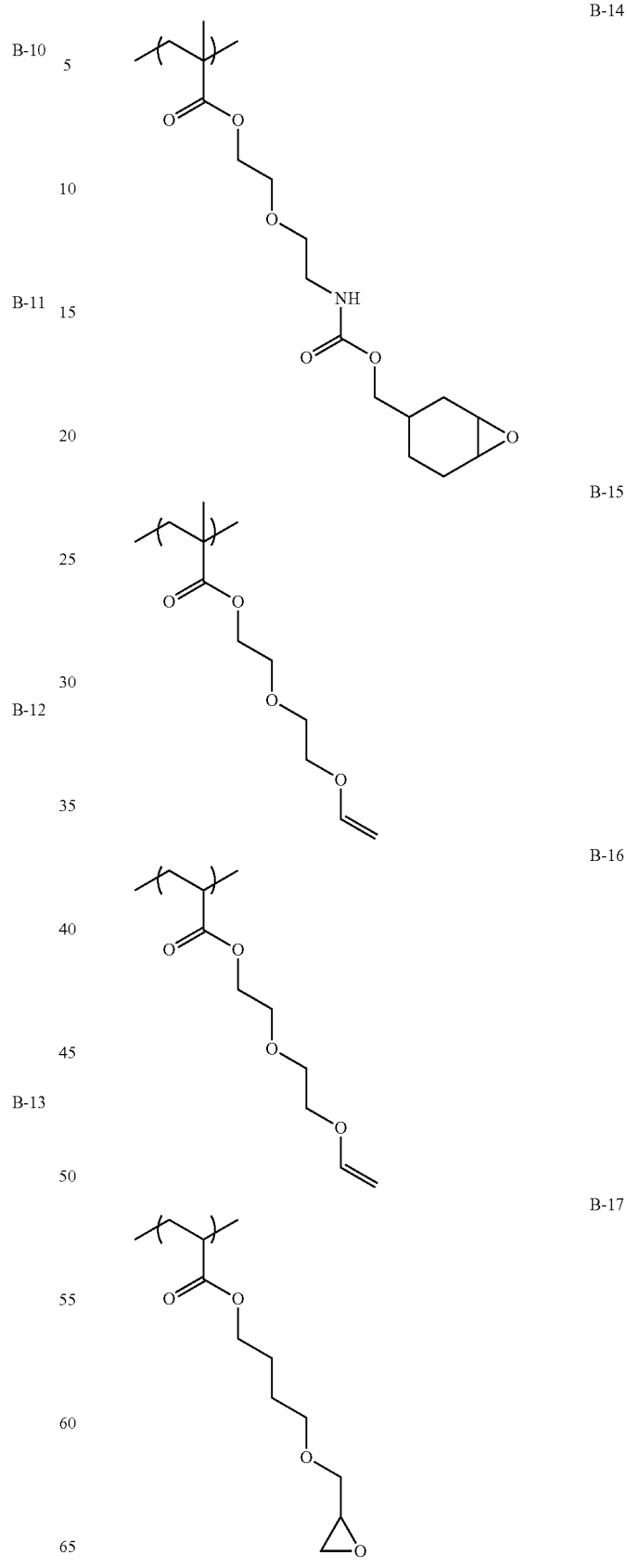

Specific examples of the repeating unit B (repeating unit B2) represented by Formula (B) include the following repeating units B-18 to B-47.
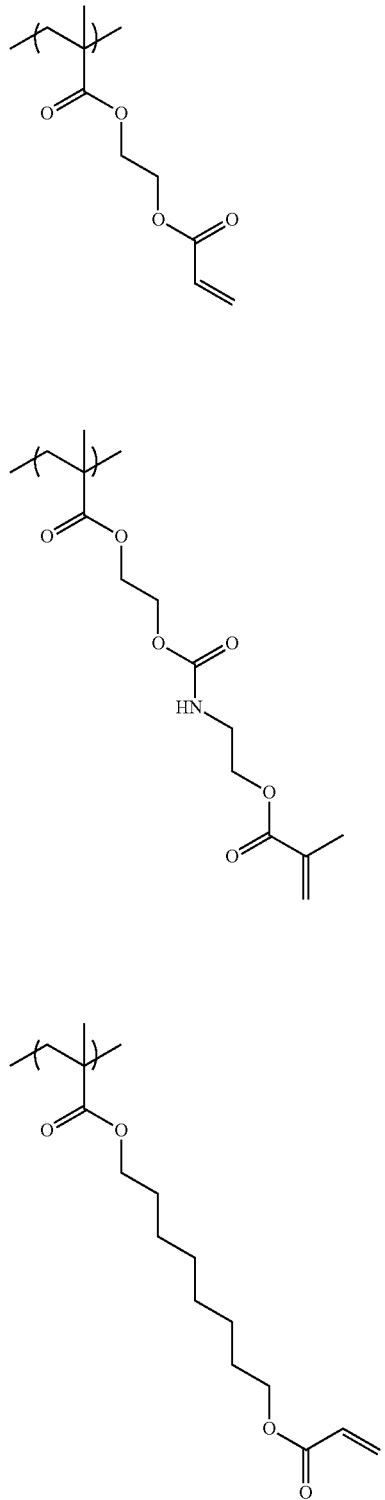
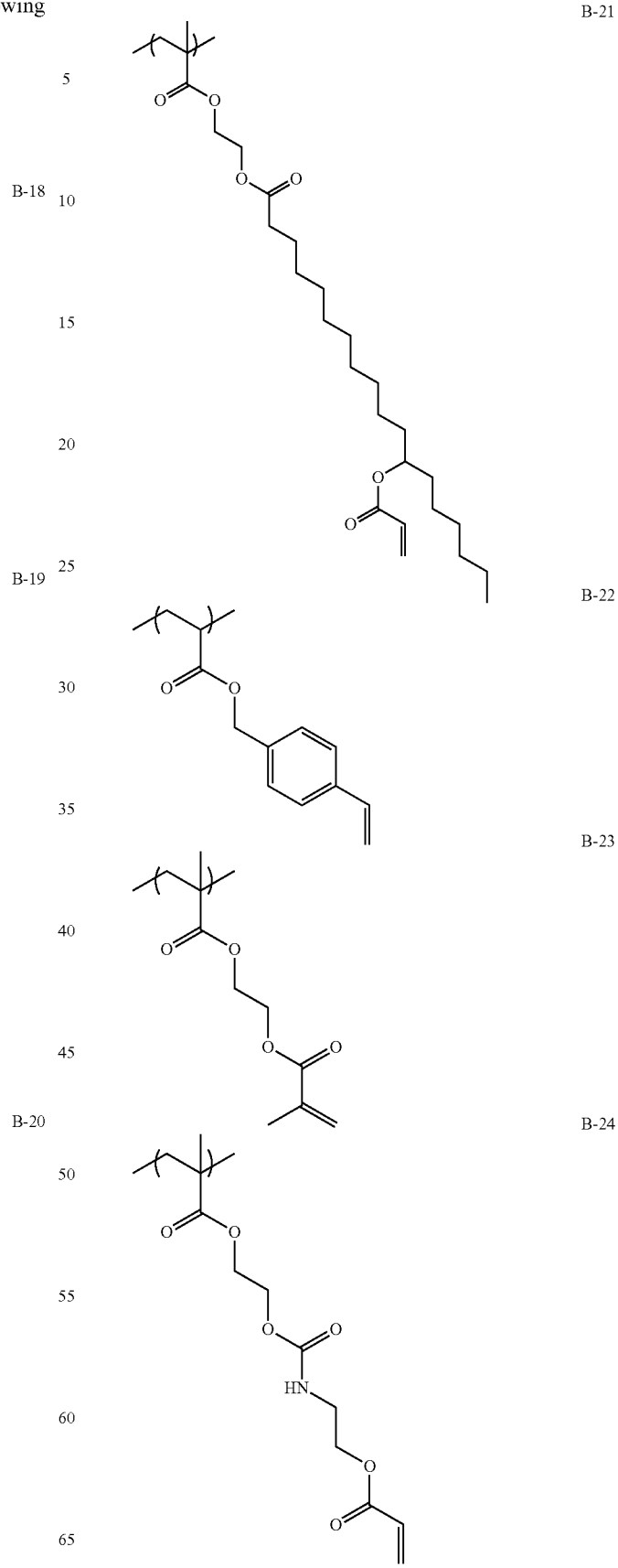

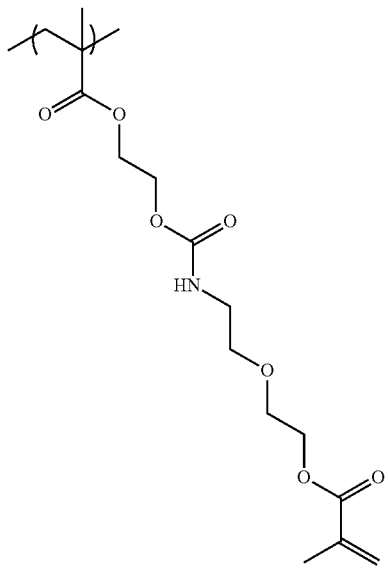

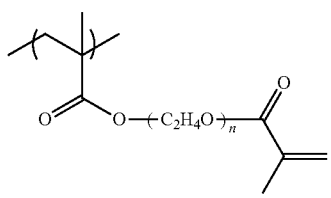

B-26 : n = 2
B-27 : n = 4.5
B-28 : n = 8

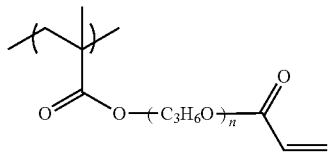

B-29 : n = 2
B-30 : n = 4.5
B-31 : n = 8

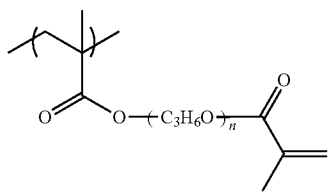

B-32 : n = 4~6
B-33 : n = 4.5
B-34 : n = 8

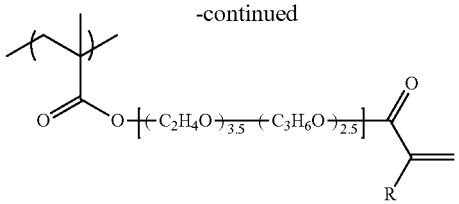

B-35 : n = 4~6
B-36 : n = 4.5
B-37 : n = 8

B-25

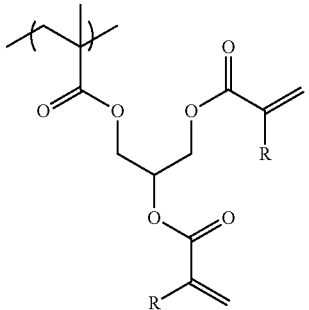

B-38 : R = H
B-39 : R = CH$_3$

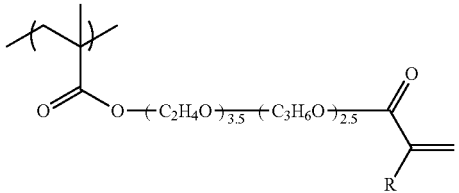

B-40 : R = H
B-41 : R = CH$_3$

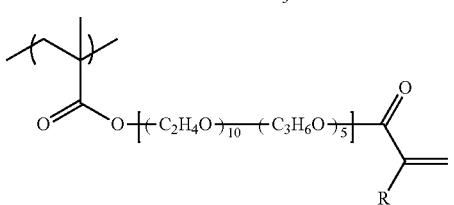

B-42 : R = H
B-43 : R = CH$_3$

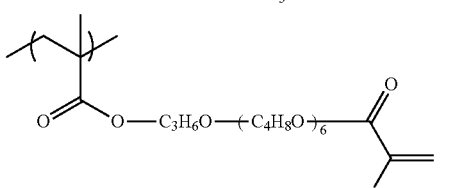

B-44 : R = H
B-45 : R = CH$_3$

B-46 : R = H
B-47 : R = CH$_3$

[Repeating Unit C]

The repeating unit C of the photo-alignment copolymer according to the embodiment of the invention includes a cleaving group which decomposes by the action of at least one selected from the group consisting of light, heat, an acid, and a base to produce a polar group.

The repeating unit C of the photo-alignment copolymer according to the embodiment of the invention has the cleaving group on a side chain, and has a group of atoms which is provided on a side closer to a terminal than the cleaving group on the side chain to be able to unevenly distribute the photo-alignment copolymer according to the embodiment of the invention on the air interface side.

Here, the "polar group" refers to a group having at least one hetero atom or halogen atom, and specific examples thereof include a hydroxyl group, a carbonyl group, a carboxy group, an amino group, a nitro group, an ammonium group, and a cyano group. Among these, a hydroxyl group and a carboxy group are preferable.

The "cleaving group which produces a polar group" refers to a group which produces the above-described polar group by cleavage, and in the invention, the cleaving group also includes a group which reacts with an oxygen molecule after radical cleavage to produce a polar group.

The "group of atoms capable of performing uneven distribution on the air interface side" refers to a group of functional group capable of, in the formation of a layer such as a binder layer by the application of a composition containing the photo-alignment copolymer according to the embodiment of the invention, unevenly distributing the photo-alignment copolymer according to the embodiment of the invention on the air interface side of the layer. Specific examples thereof include a group of atoms capable of reducing surface energy such as fluorine atoms, silicon atoms, and long-chain alkyl groups (for example, alkyl groups having 6 to 20 carbon atoms).

In the invention, since film thickness unevenness (wind unevenness) can be suppressed, the repeating unit C is preferably a unit having a cleaving group on a side chain and also having a fluorine atom or a silicon atom on a side closer to a terminal than the cleaving group on the side chain.

In the invention, since film thickness unevenness (wind unevenness) can be further suppressed, the repeating unit C is preferably a repeating unit represented by Formula (C1) or a repeating unit represented by Formula (C2-1) or (C2-2).

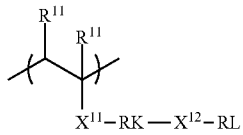

(C1)

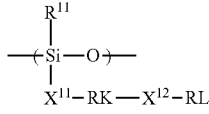

(C2-1)

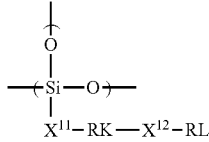

(C2-2)

In Formulae (C1) and (C2-1), $R^{11}$ represents a hydrogen atom or an alkyl group having 1 to 3 carbon atoms, and a plurality of $R^{11}$'s in Formula (C1) may be the same as or different from each other.

$R^{11}$ is preferably a hydrogen atom or a methyl group.

In Formulae (C1), (C2-1), and (C2-2), $X^{11}$ and $X^{12}$ each independently represent a single bond or a divalent linking group, RK represents the cleaving group, and RL represents a monovalent organic group containing a fluorine atom or a silicon atom.

Examples of the divalent linking group represented by $X^{11}$ and $X^{12}$ in Formulae (C1), (C2-1), and (C2-2) include at least one selected from the group consisting of a linear, branched, or cyclic alkylene group having 1 to 10 carbon atoms which may have a substituent, an arylene group having 6 to 12 carbon atoms which may have a substituent, an ether group (—O—), a carbonyl group (—C(=O)—), and an imino group (—NH—) which may have a substituent.

Here, examples of the optional substituent of the alkylene group, the arylene group, and the imino group include an alkyl group, an alkoxy group, a halogen atom, and a hydroxyl group.

The alkyl group is, for example, preferably a linear, branched, or cyclic alkyl group having 1 to 18 carbon atoms, more preferably an alkyl group having 1 to 8 carbon atoms (for example, a methyl group, an ethyl group, a propyl group, an isopropyl group, an n-butyl group, an isobutyl group, a sec-butyl group, a t-butyl group, a cyclohexyl group, and the like), even more preferably an alkyl group having 1 to 4 carbon atoms, and particularly preferably a methyl group or an ethyl group.

The alkoxy group is, for example, preferably an alkoxy group having 1 to 18 carbon atoms, more preferably an alkoxy group having 1 to 8 carbon atoms (for example, a methoxy group, an ethoxy group, an n-butoxy group, a methoxyethoxy group, and the like), even more preferably an alkoxy group having 1 to 4 carbon atoms, and particularly preferably a methoxy group or an ethoxy group.

Examples of the halogen atom include a fluorine atom, a chlorine atom, a bromine atom, and an iodine atom, and among these, a fluorine atom and a chlorine atom are preferable.

Regarding the linear, branched, or cyclic alkylene group having 1 to 10 carbon atoms, specific examples of the linear alkylene group include a methylene group, an ethylene group, a propylene group, a butylene group, a pentylene group, a hexylene group, and a decylene group.

Specific examples of the branched alkylene group include a dimethylmethylene group, a methylethylene group, a 2,2-dimethylpropylene group, and a 2-ethyl-2-methylpropylene group.

Specific examples of the cyclic alkylene group include a cyclopropylene group, a cyclobutylene group, a cyclopentylene group, a cyclohexylene group, a cyclooctylene group, a cyclodecylene group, an adamantane-diyl group, a norbornane-diyl group, and an exo-tetrahydrodicyclopentadiene-diyl group. Among these, a cyclohexylene group is preferable.

Specific examples of the arylene group having 6 to 12 carbon atoms include a phenylene group, a xylylene group, a biphenylene group, a naphthylene group, and a 2,2'-methylenebisphenyl group. Among these, a phenylene group is preferable.

Examples of the cleaving group represented by RK in Formulae (C1), (C2-1), and (C2-2) include a cleaving group (bonding) represented by any one of Formula (rk-1), . . . , or Formula (rk-13).

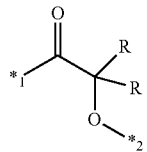

(rk-1)

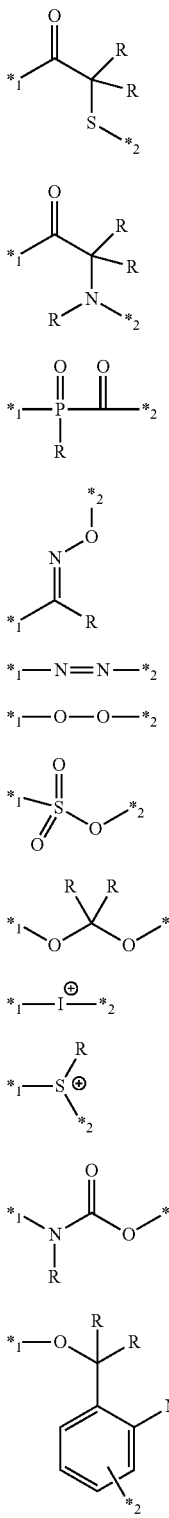

(rk-2)
(rk-3)
(rk-4)
(rk-5)
(rk-6)
(rk-7)
(rk-8)
(rk-9)
(rk-10)
(rk-11)
(rk-12)
(rk-13)

In Formulae (rk-1) to (rk-13), *1 represents a bonding position with any one of $X^{11}$ or $X^{12}$ in Formulae (C1), (C2-1), and (C2-2), *2 represents a bonding position with either $X^{11}$ or $X^{12}$ in Formulae (C1), (C2-1), and (C2-2) not bonded with *1, and R's each independently represent a hydrogen atom or a monovalent organic group.

Here, examples of the monovalent organic group represented by R include a chain or cyclic alkyl group having 1 to 20 carbon atoms and an aryl group having 6 to 20 carbon atoms which may have a substituent.

An anionic moiety in Formulae (rk-10) and (rk-11) is not particularly limited since it does not affect cleavage, and either inorganic or organic anions can be used.

Specific examples of the inorganic anion include halide ions such as chloride ions and bromide ions; and sulfonate anions.

Specific examples of the organic anion include carboxylate anions such as acetate anions; and organic sulfonate anions such as methanesulfonate anions and paratoluenesulfonate anions.

In the invention, among the cleaving groups, in a case where cleavage is caused using light, a cleaving group represented by Formula (rk-1) is preferable from the viewpoint of quantum efficiency, and in a case where cleavage is caused using an acid, a cleaving group represented by Formula (rk-9) is preferable from the viewpoint of cleavage rate.

Examples of the monovalent organic group containing a fluorine atom or a silicon atom, represented by RL in Formulae (C1), (C2-1), and (C2-2), include an alkyl group having 1 to 20 carbon atoms or an alkenyl group having 2 to 20 carbon atoms, in which at least one carbon atom has a fluorine atom as a substituent.

Specific examples of the repeating unit C include the following repeating units C-1 to C-29.

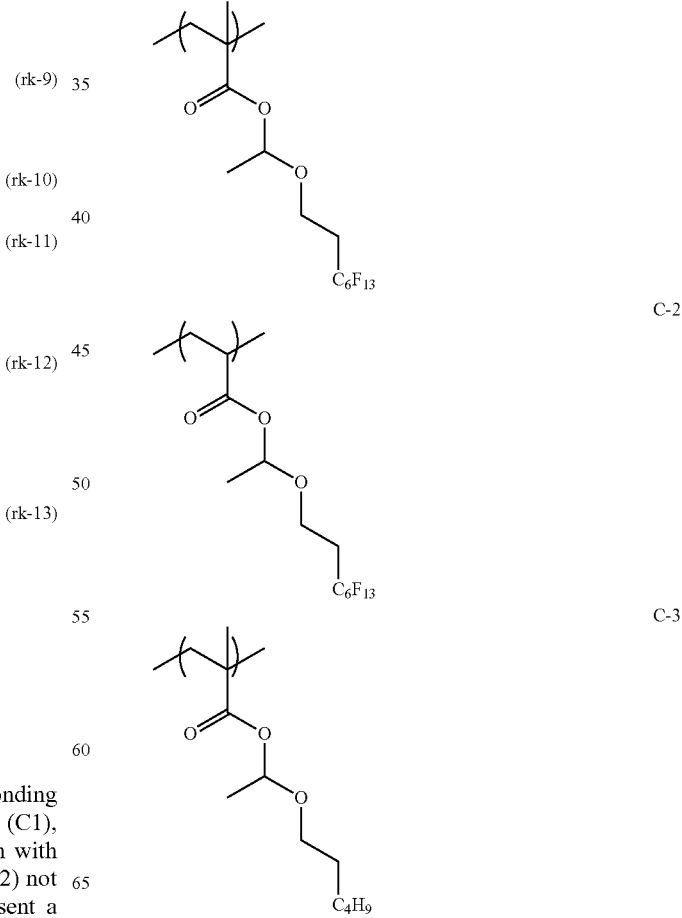

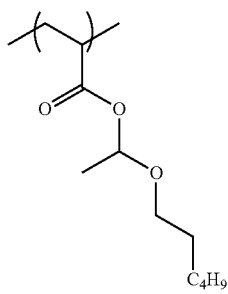
C-4
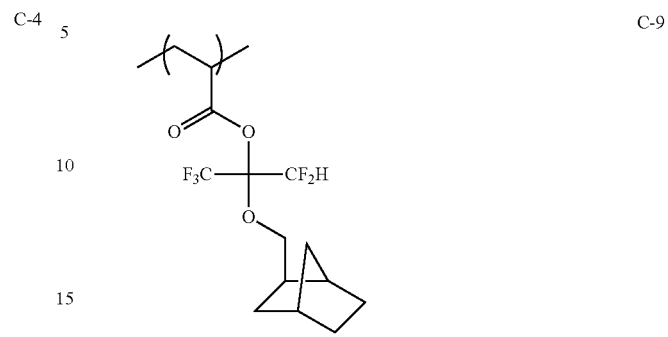
C-9
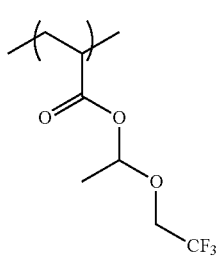
C-5
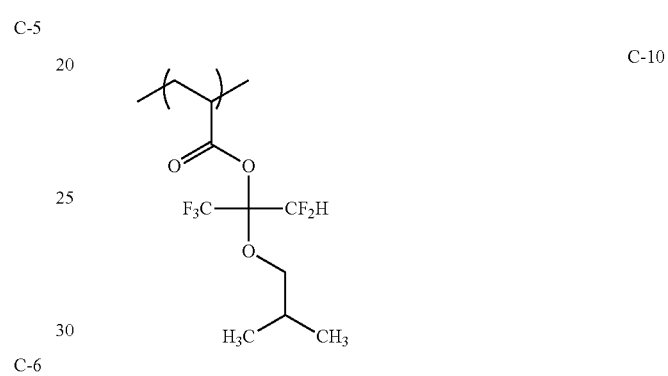
C-10
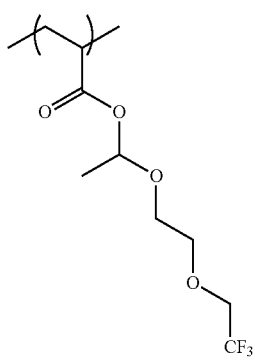
C-6
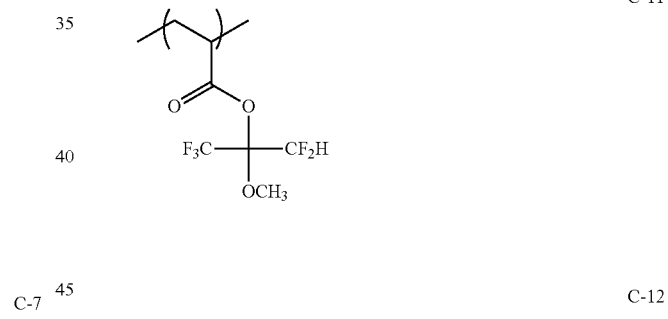
C-11
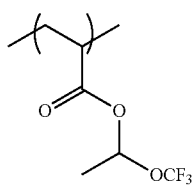
C-7
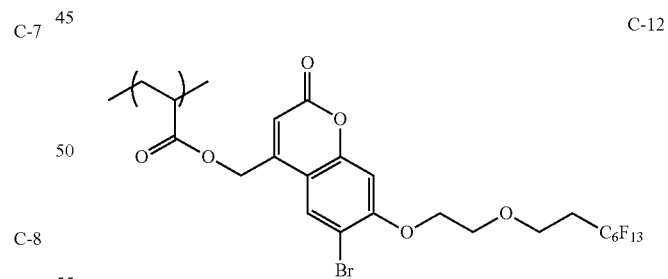
C-12
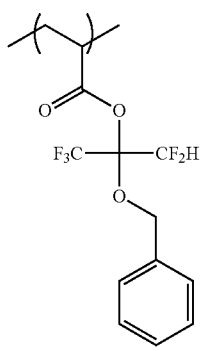
C-8
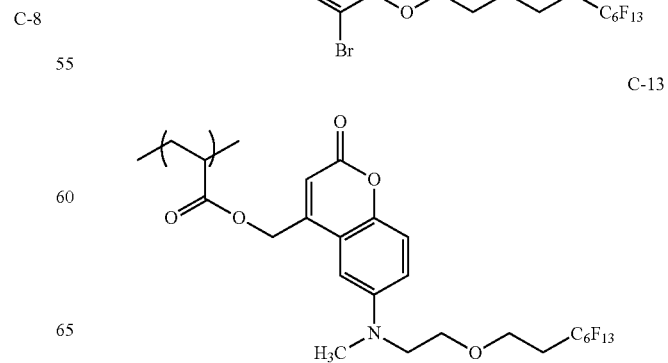
C-13

C-14
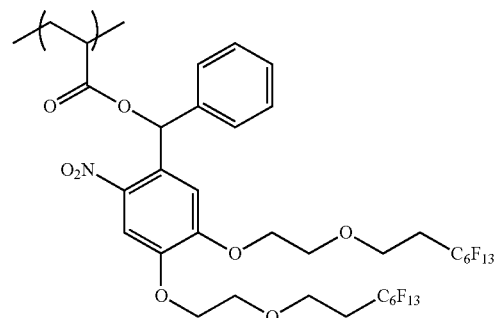
C-15
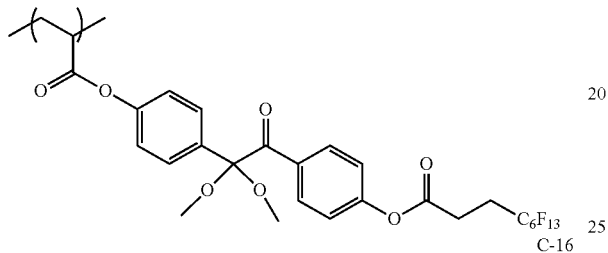
C-16
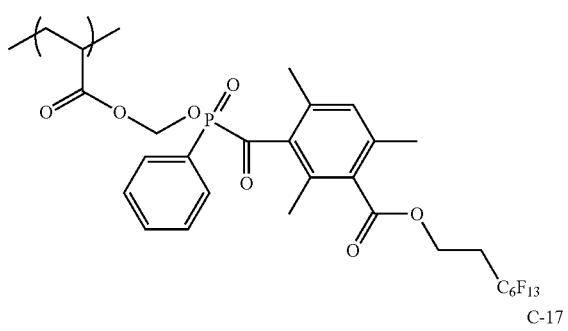
C-17
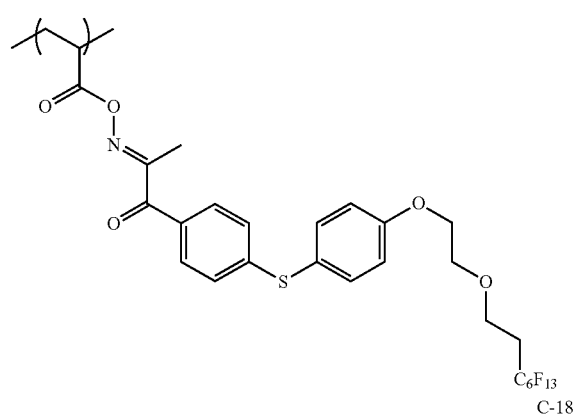
C-18
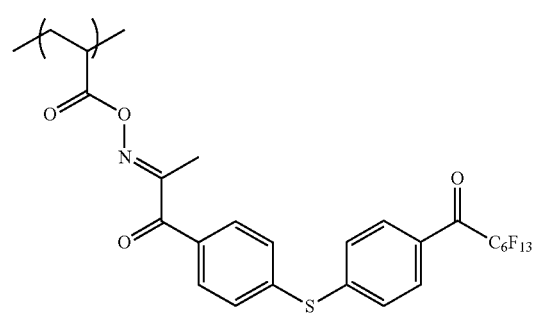
C-19
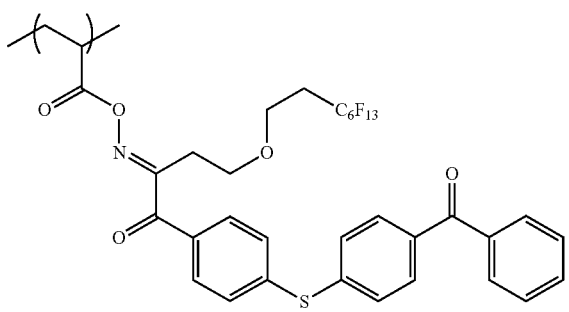
C-20
C-21
C-22
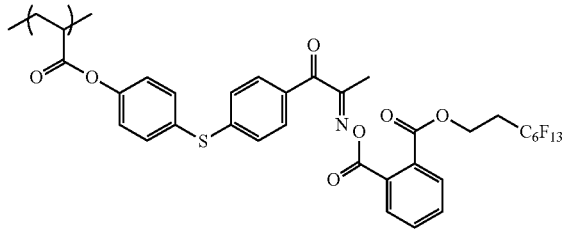
C-23
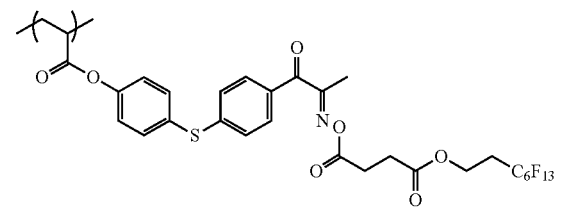

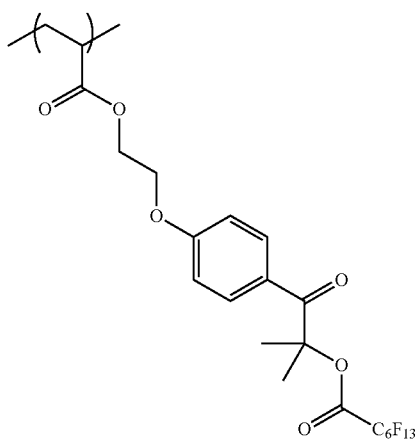

C-24

C-25

C-26

C-27

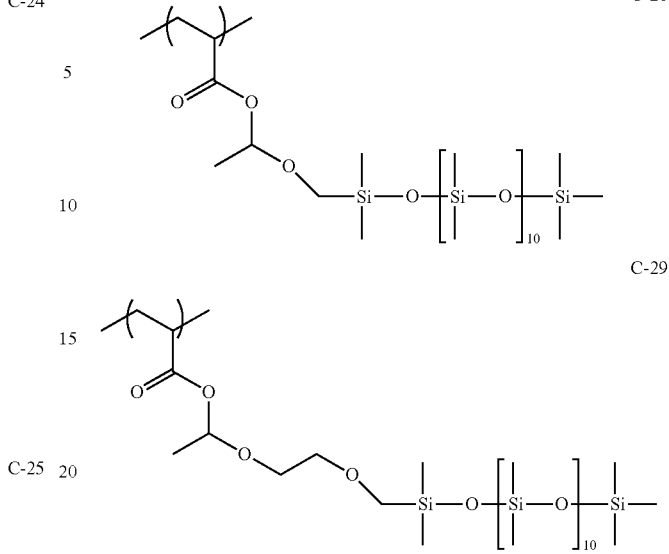

C-28

C-29

In the photo-alignment copolymer according to the embodiment of the invention, since the upper layer coatability and the liquid crystal aligning properties are improved, the content of each of the repeating units with respect to the total of the content a of the repeating unit A, the content b of the repeating unit B, and the content c of the repeating unit C preferably satisfies Expressions (W4) to (W6), more preferably satisfies Expressions (W7) to (W9), and even more preferably satisfies Expressions (W10) to (W12) by mass ratio.

| | |
|---|---|
| $0.03 \leq a/(a+b+c) \leq 0.45$ | (W4) |
| $0.45 \leq b/(a+b+c) \leq 0.90$ | (W5) |
| $0.03 \leq c/(a+b+c) \leq 0.50$ | (W6) |
| $0.03 \leq a/(a+b+c) \leq 0.40$ | (W7) |
| $0.55 \leq b/(a+b+c) \leq 0.90$ | (W8) |
| $0.03 \leq c/(a+b+c) \leq 0.40$ | (W9) |
| $0.03 \leq a/(a+b+c) \leq 0.20$ | (W10) |
| $0.60 \leq b/(a+b+c) \leq 0.80$ | (W11) |
| $0.15 \leq c/(a+b+c) \leq 0.35$ | (W12) |

[Repeating Unit D]

The photo-alignment copolymer according to the embodiment of the invention may have a repeating unit D other than the repeating unit A, the repeating unit B, and the repeating unit C described above, as long as the effects of the invention are not impaired.

In the invention, the repeating unit D is preferably a repeating unit represented by Formula (D).

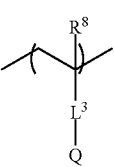

(D)

In Formula (D), $R^8$ represents a hydrogen atom or a methyl group, $L^3$ represents a divalent linking group formed by combining one or two or more groups selected from the group consisting of a linear, branched, or cyclic alkylene group having 1 to 18 carbon atoms which may have a substituent, an arylene group having 6 to 12 carbon atoms which may have a substituent, an ether group, a carbonyl group, and an imino group which may have a substituent, and Q represents any one of —OH, —COOH, or —COOtBu. "tBu" is an expression denoting tert-butyl.

Here, the substituent and the linear, branched, or cyclic alkylene group having 1 to 18 carbon atoms are the same as those described with regard to $L^2$ in Formula (B).

Specific examples of the repeating unit D represented by Formula (D) include the following repeating units D-1 to D-13.

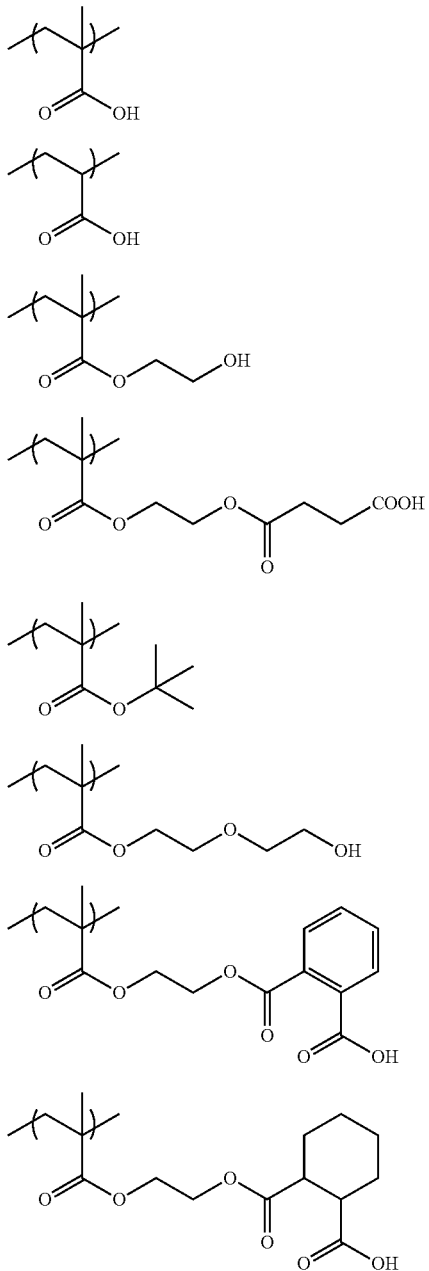

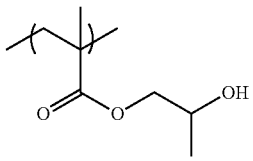

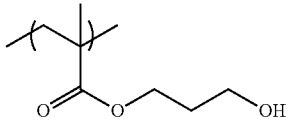

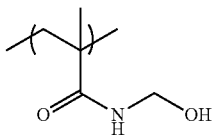

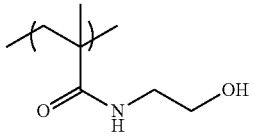

Examples of the repeating unit D represented by a formula other than Formula (D) include an acrylic acid ester compound, a methacrylic acid ester compound, the following repeating unit D-14, a maleimide compound, an acrylamide compound, acrylonitrile, maleic acid anhydride, a styrene compound, and a vinyl compound.

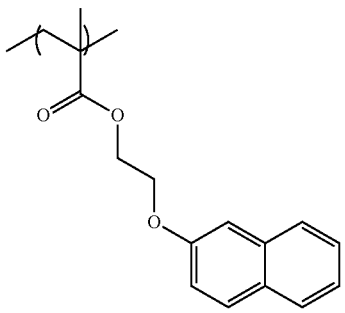

The method of synthesizing the photo-alignment copolymer according to the embodiment of the invention is not particularly limited. For example, the photo-alignment copolymer can be synthesized by mixing a monomer forming the above-described repeating unit A, a monomer forming the above-described repeating unit B, a monomer forming the above-described repeating unit C, and a monomer forming an optional repeating unit D other than the above repeating units, and polymerizing the monomers using a radical polymerization initiator in an organic solvent.

The weight-average molecular weight (Mw) of the photo-alignment copolymer according to the embodiment of the invention is preferably 10,000 to 500,000, and more preferably 30,000 to 300,000 since the liquid crystal aligning properties are improved.

Here, in the invention, the weight-average molecular weight and the number-average molecular weight are values measured by gel permeation chromatography (GPC) under the following conditions.

Solvent (eluent): Tetrahydrofuran (THF)
Device Name: TOSOH HLC-8320GPC
Column: Three items of TOSOH TSKgel Super HZM-H (4.6 mm×15 cm) are connected and used.
Column Temperature: 40° C.
Sample Concentration: 0.1 mass %
Flow Rate: 1.0 ml/min
Calibration Curve: A calibration curve made by 7 samples of TSK standard polystyrene manufactured by TOSOH Corporation, Mw of which is 2,800,000 to 1,050 (Mw/Mn=1.03 to 1.06), is used.

[Binder Composition]

A binder composition according to the embodiment of the invention contains a binder and the photo-alignment copolymer according to the embodiment of the invention.

Here, the content of the photo-alignment copolymer contained in the binder composition according to the embodiment of the invention is preferably 0.1 to 10 parts by mass, and more preferably 0.5 to 5 parts by mass with respect to 100 parts by mass of the binder to be described later.

[Binder]

The binder contained in the binder composition according to the embodiment of the invention is not particularly limited. The binder itself may be a resin (hereinafter, also referred to as "resin binder") which is formed only of a resin having no polymerization reactivity and simply dried and solidified, or a polymerizable compound.

<Resin Binder>

Specific examples of the resin binder include an epoxy resin, a diallyl phthalate resin, a silicone resin, a phenol resin, an unsaturated polyester resin, a polyimide resin, a polyurethane resin, a melamine resin, an urea resin, an ionomer resin, an ethylene ethyl acrylate resin, an acrylonitrile acrylate styrene copolymer resin, an acrylonitrile styrene resin, an acrylonitrile chloride polyethylene styrene copolymer resin, an ethylene-vinyl acetate resin, an ethylene vinyl alcohol copolymer resin, an acrylonitrile butadiene styrene copolymer resin, a vinyl chloride resin, a chlorinated polyethylene resin, a polyvinylidene chloride resin, a cellulose acetate resin, a fluorine resin, a polyoxymethylene resin, a polyamide resin, a polyarylate resin, a thermoplastic polyurethane elastomer, a polyether ether ketone resin, a polyether sulfone resin, polyethylene, polypropylene, a polycarbonate resin, polystyrene, a polystyrene maleic acid copolymer resin, a polystyrene acrylic acid copolymer resin, a polyphenylene ether resin, a polyphenylene sulfide resin, a polybutadiene resin, a polybutylene terephthalate resin, an acrylic resin, a methacrylic resin, a methylpentene resin, a polylactic acid, a polybutylene succinate resin, a butyral resin, a formal resin, polyvinyl alcohol, polyvinyl pyrrolidone, ethyl cellulose, carboxymethyl cellulose, gelatin, and copolymer resins thereof.

<Polymerizable Compound>

Examples of the polymerizable compound include an epoxy-based monomer, an acrylic monomer, and an oxetanyl-based monomer, and among these, an epoxy-based monomer and an acrylic monomer are preferable.

In the invention, a polymerizable liquid crystal compound may be used as the polymerizable compound.

(Epoxy-Based Monomer)

Examples of the epoxy group-containing monomer which is an epoxy-based monomer include a bisphenol A epoxy resin, a bisphenol F epoxy resin, a brominated bisphenol A epoxy resin, a bisphenol S epoxy resin, a diphenyl ether epoxy resin, a hydroquinone epoxy resin, a naphthalene epoxy resin, a biphenyl epoxy resin, a fluorene epoxy resin, a phenol novolac epoxy resin, an orthocresol novolac epoxy resin, a trishydroxyphenylmethane epoxy resin, a trifunctional epoxy resin, a tetraphenylolethane epoxy resin, a dicyclopentadiene phenol epoxy resin, a hydrogenated bisphenol A epoxy resin, a bisphenol A nucleus-containing polyol epoxy resin, a polypropylene glycol epoxy resin, a glycidyl ester epoxy resin, a glycidylamine epoxy resin, a glyoxal epoxy resin, an alicyclic epoxy resin, and a heterocyclic epoxy resin.

(Acrylic Monomer)

Examples of the acrylate monomer and the methacrylate monomer, which are acrylic monomers, include trifunctional monomers such as trimethylolpropane triacrylate, trimethylolpropane propylene oxide (PO)-modified triacrylate, trimethylolpropane ethylene oxide (EO)-modified triacrylate, trimethylolpropane trimethacrylate, and pentaerythritol triacrylate. The examples further include tetrafunctional or higher-functional monomers or oligomers such as pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

(Polymerizable Liquid Crystal Compound)

The polymerizable liquid crystal compound is not particularly limited, and for example, a compound in which any one of homeotropic alignment, homogeneous alignment, hybrid alignment, or cholesteric alignment can be performed can be used.

Here, in general, liquid crystal compounds can be classified into a rod-like type and a disk-like type according to the shape thereof. Furthermore, each type includes a low molecular type and a high molecular type. The term high molecular generally refers to a compound having a degree of polymerization of 100 or greater (Polymer Physics-Phase Transition Dynamics, written by Masao Doi, p. 2, published by Iwanami Shoten, 1992). In the invention, any liquid crystal compound can be used, and a rod-like liquid crystal compound (hereinafter, also abbreviated as "CLC") or a discotic liquid crystal compound (disk-like liquid crystal compound) (hereinafter, also abbreviated as "DLC") is preferably used. In addition, a liquid crystal compound which is a monomer or has a relatively low molecular weight with a degree of polymerization of less than 100 is preferably used.

Specific examples of the polymerizable group of the polymerizable liquid crystal compound include an acryloyl group, a methacryloyl group, an epoxy group, and a vinyl group.

By polymerizing such a polymerizable liquid crystal compound, the alignment of the liquid crystal compound can be fixed. After fixing of the liquid crystal compound by polymerization, it is no longer necessary to exhibit liquid crystallinity.

As the rod-like liquid crystal compound, for example, those described in claim 1 of JP1999-513019A (JP-H11-513019A) or paragraphs [0026] to [0098] of JP2005-289980A can be preferably used, and as the discotic liquid crystal compound, for example, those described in paragraphs [0020] to [0067] of JP2007-108732A or paragraphs [0013] to [0108] of JP2010-244038A can be preferably used. However, the examples thereof are not limited thereto.

In the invention, a liquid crystal compound having reciprocal wavelength dispersibility can be used as the above-described polymerizable liquid crystal compound.

Here, in this specification, the liquid crystal compound having "reciprocal wavelength dispersibility" refers to the fact that in the measurement of an in-plane retardation (Re) value at a specific wavelength (visible light range) of a retardation film produced using the liquid crystal compound, as the measurement wavelength increases, the Re value is the same or increased.

The liquid crystal compound having reciprocal wavelength dispersibility is not particularly limited as long as a film having reciprocal wavelength dispersibility can be formed as described above, and for example, compounds represented by Formula (I) described in JP2008-297210A (particularly, compounds described in paragraphs [0034] to [0039]), compounds represented by Formula (1) described in JP2010-084032A (particularly, compounds described in paragraphs [0067] to [0073]), and compounds represented by Formula (1) described in JP2016-081035A (particularly, compounds described in paragraphs [0043] to [0055]) can be used.

Compounds described in paragraphs [0027] to [0100] of JP2011-006360A, paragraphs [0028] to [0125] of JP2011-006361A, paragraphs [0034] to [0298] of JP2012-207765A, paragraphs [0016] to [0345] of JP2012-077055A, paragraphs [0017] to [0072] of WO12/141245A, paragraphs [0021] to [0088] of WO12/147904A, and paragraphs [0028] to [0115] of WO14/147904A can also be used.

[Polymerization Initiator]

In a case where a polymerizable compound is used as the binder, the binder composition according to the embodiment of the invention preferably contains a polymerization initiator.

Such a polymerization initiator is not particularly limited, and examples thereof include a thermal polymerization initiator and a photopolymerization initiator depending on the method of a polymerization reaction.

In the invention, the polymerization initiator is preferably a photopolymerization initiator capable of starting a polymerization reaction by ultraviolet irradiation.

Examples of the photopolymerization initiator include α-carbonyl compounds (described in U.S. Pat. Nos. 2,367,661A and 2,367,670A), acyloin ethers (described in U.S. Pat. No. 2,448,828A), α-hydrocarbon-substituted aromatic acyloin compounds (described in U.S. Pat. No. 2,722,512A), polynuclear quinone compounds (described in U.S. Pat. Nos. 3,046,127A and 2,951,758A), combinations of tri-arylimidazole dimer and p-aminophenyl ketone (described in U.S. Pat. No. 3,549,367A), acridine and phenazine compounds (described in JP1985-105667A (JP-S60-105667A) and U.S. Pat. No. 4,239,850A), oxadiazole compounds (described in U.S. Pat. No. 4,212,970A), and acylphosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

[Photo-Acid Generator]

In a case where the above-described photo-alignment copolymer is a copolymer having a monovalent specific group including a cleaving group which decomposes by the action of an acid to produce a polar group, the binder composition according to the embodiment of the invention preferably contains a photo-acid generator.

The photo-acid generator is preferably a compound which is sensitive to actinic rays having a wavelength of 300 nm or more, preferably 300 to 450 nm, and generates an acid, and is not limited to a chemical structure thereof. A photo-acid generator which is not directly sensitive to actinic rays having a wavelength of 300 nm or more can also be preferably used in combination with a sensitizer as long as it is a compound which is sensitive to actinic rays having a wavelength of 300 nm or more and generates an acid by being used in combination with the sensitizer. The photo-acid generator used in the invention is preferably a photo-acid generator which generates an acid with a pKa of 4 or less, more preferably a photo-acid generator which generates an acid with a pKa of 3 or less, and most preferably a photo-acid generator which generates an acid with a pKa of 2 or less. In the invention, the pKa basically refers to a pKa in water at 25° C. Those which cannot be measured in water refer to those measured after changing to a solvent suitable for the measurement. Specifically, the pKa described in a chemical handbook or the like can be referred to. The acid with a pKa of 3 or less is preferably a sulfonic acid or a phosphonic acid, and more preferably a sulfonic acid.

Examples of the photo-acid generator include an onium salt compound, trichloromethyl-s-triazines, a sulfonium salt, an iodonium salt, a quaternary ammonium salt, a diazomethane compound, an imidosulfonate compound, and an oxime sulfonate compound. Among these, an onium salt compound, an imidosulfonate compound, and an oxime sulfonate compound are preferable, and an onium salt compound and an oxime sulfonate compound are particularly preferable. The photo-acid generators can be used alone or in combination of two or more types thereof.

[Solvent]

The binder composition according to the embodiment of the invention preferably contains a solvent from the viewpoint of workability or the like for forming a binder layer.

Specific examples of the solvent include ketones (for example, acetone, 2-butanone, methyl isobutyl ketone, and cyclohexanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide). These may be used alone or in combination of two or more types thereof.

[Binder Layer]

A binder layer according to the embodiment of the invention is formed of the above-described binder composition according to the embodiment of the invention, and has an alignment regulating force.

The method of forming the binder layer is not particularly limited since it differs depending on the type of the binder, and in a case where a polymerizable compound is used as the binder, the layer can be formed by a method which has been known, such as photocationic polymerization or radical polymerization.

The expression "has an alignment regulating force" means having a function of aligning a liquid crystal compound disposed on the binder layer in a predetermined direction.

[Optical Laminate]

An optical laminate according to the embodiment of the invention is an optical laminate having the binder layer according to the embodiment of the invention and an optically anisotropic layer provided on the binder layer.

In the optical laminate according to the embodiment of the invention, the optically anisotropic layer provided on the binder layer is formed of a polymerizable liquid crystal composition containing a polymerizable liquid crystal compound. In addition, the binder layer and the optically anisotropic layer are laminated adjacent to each other.

The optical laminate according to the embodiment of the invention preferably has a support which supports the binder layer.

Hereinafter, preferable aspects of the optical laminate according to the embodiment of the invention will be described in detail.

[Support]

Examples of the support include a glass substrate and a polymer film.

Examples of the material of the polymer film include cellulose-based polymers; acrylic polymers having an acrylic ester polymer such as polymethyl methacrylate and a lactone ring-containing polymer; thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

The thickness of the support is not particularly limited, and is preferably 5 to 200 µm, more preferably 10 to 100 µm, and even more preferably 20 to 90 µm.

[Binder Layer]

The binder layer is the above-described binder layer according to the embodiment of the invention.

In the invention, the thickness of the binder layer is not particularly limited, and is preferably 0.1 to 10 µm, and more preferably 0.5 to 5 µm.

[Optically Anisotropic Layer]

As described above, the optically anisotropic layer is formed of a polymerizable liquid crystal composition containing a polymerizable liquid crystal compound.

Here, examples of the polymerizable liquid crystal composition for forming the optically anisotropic layer include a composition obtained by blending the polymerizable liquid crystal compound described as an optional component in the binder composition according to the embodiment of the invention, a polymerization initiator, a solvent, and the like.

In the invention, the thickness of the optically anisotropic layer is not particularly limited, and is preferably 0.1 to 10 µm, and more preferably 0.5 to 5 µm.

[Producing Method of Optical Laminate]

The method of producing the optical laminate according to the embodiment of the invention is not particularly limited. For example, the optical laminate can be produced using a method including a first coating step of applying the above-described binder composition according to the embodiment of the invention to the above-described support, a binder layer forming step of forming a binder layer after the first coating step, an action step of causing the action of at least one selected from the group consisting of light, heat, an acid, and a base, an irradiation step of performing irradiation with polarized or non-polarized light, a second coating step of directly applying a polymerizable liquid crystal composition for forming an optically anisotropic layer to the binder layer, and an optically anisotropic layer forming step of forming an optically anisotropic layer after the second coating step.

The action step is a step which is performed between the binder layer forming step and the second coating step, or simultaneously with the binder layer forming step or the second coating step.

The irradiation step is a step which is performed between the binder layer forming step and the second coating step, or simultaneously with the binder layer forming step or the second coating step.

[First Coating Step]

The first coating step is a step of applying the above-described binder composition according to the embodiment of the invention to the above-described support.

The method of performing coating with the binder composition according to the embodiment of the invention is not particularly limited, and specific examples of the coating method include a spin coating method, an air knife coating method, a curtain coating method, a roller coating method, a wire bar coating method, a gravure coating method, and a die coating method.

[Binder Layer Forming Step]

The binder layer forming step is a step of forming a binder layer after the first coating step, and the binder layer can be formed by performing a curing treatment (irradiation with ultraviolet rays (light irradiation treatment) or heating treatment) on the coating film obtained in the first coating step.

The conditions of the curing treatment are not particularly limited, and ultraviolet rays are preferably used in polymerization by light irradiation. The irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1,000 mJ/cm$^2$. In order to promote the polymerization reaction, the treatment may be performed under heating conditions.

[Action Step]

The action step is a step of causing the action of at least one selected from the group consisting of light, heat, an acid, and a base.

The action step is a step which is performed between the binder layer forming step and the second coating step, or simultaneously with the binder layer forming step or the second coating step from the viewpoint of securing coatability in the formation of the optically anisotropic layer as an upper layer.

Here, the expression "between the binder layer forming step and the second coating step" means that before the second coating step, the action step (for example, a step of causing the action of light) is performed on the binder layer formed in the binder layer forming step (for example, thermal polymerization).

The expression "simultaneously with the binder layer forming step" means that the step of forming the binder layer, e.g., the step of forming the binder layer by the polymerization of an olefin-based monomer by photo-radical generation, the polymerization of an epoxy monomer by photo-acid generation, and the like, and the action step (for example, a step of causing the action of light) are simultaneously performed. That is, this means that light which is used for polymerization of the binder layer and light which is used for cleavage cause two actions simultaneously.

The expression "simultaneously with the second coating step" means that the action step (for example, a step of causing the action of heat) is performed at the same time when the second coating step is performed on the binder layer formed in the binder layer forming step (for example, photopolymerization).

Among these, the action step is preferably a step which causes the action of light and is performed simultaneously with the binder layer forming step from the viewpoint of process simplification.

Examples of the method of causing the action of light include a method of irradiating the binder layer with ultraviolet rays. As a light source, a lamp emitting ultraviolet rays, such as a high-pressure mercury lamp and a metal halide lamp, can be used. The irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1,000 mJ/cm$^2$.

Examples of the method of causing the action of heat include a method of heating the binder layer. The heating temperature is preferably 50° C. to 200° C., more preferably 60° C. to 150° C., and particularly preferably 70° C. to 130° C.

Examples of the method of causing the action of an acid include a method of adding an acid to the binder layer in advance, a method of adding a photo-acid generator to the binder layer to generate an acid by using light as a trigger, and a method of adding a thermal acid generator to the binder layer to generate an acid by using heat as a trigger. Among these, a method using a photo-acid generator and a method using a thermal acid generator are preferable.

Examples of the method of causing the action of a base include a method of adding a base to the binder layer in advance, a method of adding a photo-base generator to the binder layer to generate a base by using light as a trigger, and a method of adding a thermal base generator to the binder layer to generate a base by using heat as a trigger. Among these, a method using a photo-base generator and a method using a thermal base generator are preferable.

[Irradiation Step]

The irradiation step is a step of performing irradiation with polarized or non-polarized light, that is, a step of forming a binder layer imparted with an alignment regulating force.

The irradiation step is a step which is performed between the binder layer forming step and the second coating step, or simultaneously with the binder layer forming step or the second coating step from the viewpoint of securing coatability in the formation of the optically anisotropic layer as an upper layer.

Here, the expression "between the binder layer forming step and the second coating step" means that before the second coating step, the irradiation step (for example, polarized light irradiation step) is performed on the binder layer formed in the binder layer forming step (for example, thermal polymerization).

The expression "simultaneously with the binder layer forming step" means that the step of forming the binder layer, e.g., the step of forming the binder layer by the polymerization of an olefin-based monomer by photo-radical generation, the polymerization of an epoxy monomer by photo-acid generation, and the like, and the irradiation step (for example, polarized light irradiation step) are simultaneously performed. That is, this means that light which is used for polymerization of the binder layer and light which is used for alignment cause two actions simultaneously.

The expression "simultaneously with the second coating step" means that the irradiation step (for example, polarized light irradiation step) is performed at the same time when the second coating step is performed on the binder layer formed in the binder layer forming step (for example, photopolymerization).

The irradiation step is preferably performed between the binder layer forming step and the second coating step.

In the irradiation step, the polarized light to be applied is not particularly limited. Examples thereof include linearly polarized light, circularly polarized light, and elliptically polarized light, linearly polarized light is preferable.

Preferable examples of the irradiation method include a method of polarizing and applying ultraviolet rays, and specific examples thereof include a method using a polarizing plate (for example, an iodine polarizing plate, a dichroic dye polarizing plate, and a wire grid polarizing plate); a method using a prism-based element (for example, a Glan-Thompson prism) or a reflective-type polarizer using the Brewster angle; and a method using light emitted from a laser light source having polarized light.

Here, the light source used for ultraviolet irradiation is not particularly limited as long as it is a light source which generates ultraviolet rays. For example, a low pressure mercury lamp, a medium pressure mercury lamp, a high pressure mercury lamp, an ultra-high pressure mercury lamp, a carbon arc lamp, a metal halide lamp, a xenon lamp, or the like can be used.

[Second Coating Step]

The second coating step is a step of directly applying a polymerizable liquid crystal composition for forming an optically anisotropic layer to the binder layer.

The method of applying the polymerizable liquid crystal composition for forming an optically anisotropic layer is not particularly limited, and examples thereof include the same method as the first coating step.

[Optically Anisotropic Layer Forming Step]

The optically anisotropic layer forming step is a step of forming an optically anisotropic layer after the second coating step. The optically anisotropic layer can be formed by performing a curing treatment (irradiation with ultraviolet rays (light irradiation treatment) or heating treatment) on the coating film obtained in the second coating step.

The conditions of the curing treatment are not particularly limited, and ultraviolet rays are preferably used in polymerization by light irradiation. The irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1,000 mJ/cm$^2$. In order to promote the polymerization reaction, the treatment may be performed under heating conditions.

[Image Display Device]

An image display device according to the embodiment of the invention is an image display device having the optically anisotropic layer according to the invention or the optical laminate according to the embodiment of the invention.

The display element which is used in the image display device according to the embodiment of the invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, the image display device according to the embodiment of the invention is preferably a liquid crystal display device using a liquid crystal cell as a display element or an organic EL display device using an organic EL display panel as a display element.

[Liquid Crystal Display Device]

A liquid crystal display device as an example of the image display device according to the embodiment of the invention has the optically anisotropic layer according to the invention or the optical laminate according to the embodiment of the invention described above, and a liquid crystal cell.

Hereinafter, the liquid crystal cell constituting the liquid crystal display device will be described in detail.

<Liquid Crystal Cell>

The liquid crystal cell which is used in the liquid crystal display device is preferably a vertical alignment (VA) mode, an optically compensated bend (OCB) mode, an in-plane-switching (IPS) mode, or a twisted nematic (TN) mode, but is not limited thereto.

In a TN mode liquid crystal cell, rod-like liquid crystalline molecules (rod-like liquid crystal compound) are substantially horizontally aligned with no voltage application thereto, and subjected to twist alignment of 60° to 120°. The TN mode liquid crystal cell is the most frequently used as a color TFT liquid crystal display device, and there are descriptions in many literatures.

In a VA mode liquid crystal cell, rod-like liquid crystalline molecules are substantially vertically aligned with no voltage application thereto. The VA mode liquid crystal cell may be any one of (1) a VA mode liquid crystal cell in the narrow sense in which rod-like liquid crystalline molecules are substantially vertically aligned with no voltage application thereto, but are substantially horizontally aligned in the presence of voltage application thereto (described in JP1990-176625A (JP-H2-176625A)); (2) a (multi-domain vertical alignment (MVA) mode) liquid crystal cell attaining multi-domain of the VA mode for view angle enlargement (described in SID97, Digest of tech. Papers (proceedings) 28 (1997), 845), (3) an (n-axially symmetric aligned microcell (ASM) mode) liquid crystal cell in which rod-like liquid crystalline molecules are substantially vertically aligned with no voltage application thereto, but are subjected to twist multi-domain alignment in the presence of voltage application thereto (described in proceedings of Japan Liquid Crystal Debating Society, 58 to 59 (1998)), or (4) a super ranged viewing by vertical alignment (SURVIVAL) mode liquid crystal cell (published in liquid crystal display (LCD) International 98). In addition, the VA mode liquid crystal cell may be any one of a patterned vertical alignment (PVA) type, an optical alignment type, or a polymer-sustained alignment (PSA) type. The details of the modes are described in JP2006-215326A and JP2008-538819A.

In an IPS mode liquid crystal cell, rod-like liquid crystalline molecules are aligned to be substantially parallel to the substrate. The liquid crystalline molecules planarly respond by the application of an electric field parallel to a substrate surface. In the IPS mode, black display is performed during application of no electric field, and the absorption axes of a pair of upper and lower polarizing plates are perpendicular to each other. A method of improving a view angle by reducing light leakage at the time of black display in an oblique direction by using an optical compensation sheet is disclosed in JP1998-054982A (JP-H10-054982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Suitable examples of the organic EL display device as an example of the image display device according to the embodiment of the invention include a device having an aspect in which it has a polarizer, the optically anisotropic layer according to the invention or the optical laminate according to the embodiment of the invention, and an organic EL display panel in this order from the viewing side.

<Polarizer>

The polarizer is not particularly limited as long as it is a member having a function of converting light into specific linearly polarized light. An absorption-type polarizer or a reflective-type polarizer which has been known can be used.

As the absorption-type polarizer, an iodine-based polarizer, a dye-based polarizer using a dichroic dye, a polyene-based polarizer, or the like is used. The iodine-based polarizer and the dye-based polarizer include a coating-type polarizer and a stretching-type polarizer, and any of these is applicable.

Examples of the method of obtaining a polarizer by performing stretching and dyeing in a state in which a laminate film is obtained by forming a polyvinyl alcohol layer on a base include JP5048120B, JP5143918B, JP4691205B, JP4751481B, and JP4751486B. These known technologies concerning a polarizer can also be preferably used.

As the reflective-type polarizer, a polarizer obtained by laminating thin films having different birefringences, a wire grid-type polarizer, a polarizer obtained by combining a cholesteric liquid crystal having a selective reflection area and a ¼ wavelength plate, or the like is used.

Among these, in view of more excellent adhesiveness, a polarizer including a polyvinyl alcohol-based resin (a polymer containing —$CH_2$—CHOH— as a repeating unit, particularly, at least one selected from the group consisting of a polyvinyl alcohol and an ethylene-vinyl alcohol copolymer) is preferable.

The thickness of the polarizer is not particularly limited, and is preferably 3 μm to 60 μm, more preferably 5 μm to 30 μm, and even more preferably 5 μm to 15 μm.

<Organic EL Display Panel>

The organic EL display panel is a member in which a light emitting layer or a plurality of organic compound thin films including a light emitting layer is formed between a pair of electrodes of an anode and a cathode. In addition to the light emitting layer, a hole injection layer, a hole transport layer, an electron injection layer, an electron transport layer, a protective layer, and the like may be provided, and each of these layers may have a different function. Various materials can be used to form the respective layers.

EXAMPLES

Hereinafter, the invention will be more specifically described based on examples. Materials, used amounts, ratios, treatment contents, treatment procedures, and the like of the following examples are able to be suitably changed unless the changes cause deviance from the gist of the invention. Therefore, the range of the invention will not be restrictively interpreted by the following examples.

Example 1-1

5 parts by mass of 2-butanone as a solvent was put into a flask comprising a cooling pipe, a thermometer, and a stirrer, and refluxing was performed by heating in a water bath with nitrogen flowing into the flask at 5 mL/min. Here, a solution obtained by mixing 50 parts by mass of the following monomer mA-52, 20 parts by mass of the following monomer mB-2, 30 parts by mass of the following monomer mC-1, 1 part by mass of 2,2'-azobis(isobutyronitrile) as a polymerization initiator, and 5 parts by mass of 2-butanone as a solvent was added dropwise thereto for 3 hours, and the mixture was stirred while maintaining the refluxing state for 3 hours. After completion of the reaction, the reaction mixture was allowed to cool to room temperature, and 30 parts by mass of 2-butanone was added and diluted to obtain about 20 mass % of a polymer solution. The obtained polymer solution was poured into a large excess of methanol to precipitate the polymer, and the collected precipitate was separated by filtering and washed with a large amount of methanol. Then, the resulting material was subjected to blast drying at 50° C. for 12 hours, and thus a copolymer P-1 having the repeating unit A-52, the repeating unit B-2, and the repeating unit C-1 described above, each of which was contained as shown in the following Table 1 by parts by mass, was obtained.

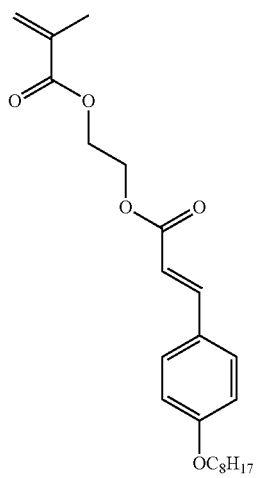

Examples 1-2 to 1-11 and Comparative Example 1-1

Copolymers were synthesized in the same manner as in the case of the copolymer P-1 synthesized in Example 1, except that the synthesized monomers were respectively used as monomers forming the repeating units shown in the following Table 1, and the amount of the polymerization initiator to be added was changed such that the weight-average molecular weights were provided as shown in the following Table 1.

In the following Table 1, the structures of the repeating unit A-9, the repeating unit B-2, and the like are the same as those described in the descriptions of the respective repeating units.

The weight-average molecular weight of each of the synthesized copolymers was measured by the above-described method. The results are shown in the following Table 1.

TABLE 1

| | Copolymer | Repeating Unit A Structure | Repeating Unit A Content (parts by mass) | Repeating Unit B Structure | Repeating Unit B Content (parts by mass) | Repeating Unit C Structure | Repeating Unit C Content (parts by mass) | Repeating Unit Other Than Repeating Units A to C Structure | Repeating Unit Other Than Repeating Units A to C Content (parts by mass) | Weight-Average Molecular Weight |
|---|---|---|---|---|---|---|---|---|---|---|
| Example 1-1 | P-1 | A-52 | 50 | B-2 | 20 | C-1 | 30 | — | — | 40,000 |
| Example 1-2 | P-2 | A-52 | 50 | B-18 | 20 | C-1 | 30 | — | — | 50,000 |
| Example 1-3 | P-3 | A-52 | 60 | B-2 | 20 | C-17 | 20 | — | — | 25,000 |
| Example 1-4 | P-4 | A-52 | 50 | B-2 | 20 | C-3 | 30 | — | — | 28,000 |
| Example 1-5 | P-5 | A-52 | 60 | B-2 | 20 | C-1 | 20 | — | — | 30,000 |
| Example 1-6 | P-6 | A-9 | 20 | B-2 | 50 | C-1 | 30 | — | — | 30,000 |
| Example 1-7 | P-7 | A-9 | 20 | B-18 | 50 | C-17 | 30 | — | — | 30,000 |
| Example 1-8 | P-8 | A-9 | 12 | B-2 | 58 | C-1 | 30 | — | — | 30,000 |
| Example 1-9 | P-9 | A-9 | 12 | B-2 | 58 | C-1 | 30 | — | — | 40,000 |
| Example 1-10 | P-10 | A-9 | 12 | B-2 | 58 | C-1 | 25 | D-14 | 5 | 40,000 |
| Example 1-11 | P-11 | A-9 | 12 | B-2 | 58 | C-1 | 25 | D-1 | 5 | 40,000 |
| Comparative Example 1-1 | H-1 | A-52 | 50 | B-2 | 50 | — | — | — | — | 36,000 |

Next, with the copolymers synthesized in Examples 1-4, 1-9, and 1-11 and Comparative Example 1-1, optical laminates were respectively produced by the following method and evaluated as shown below.

Example 2-1

[Production of Binder Layer]

An acrylic monomer (PETA, manufactured by OSAKA ORGANIC CHEMICAL INDUSTRY LTD.) (100 parts by mass), a photopolymerization initiator (IRGACURE 819, manufactured by BASF SE) (3 parts by mass), the following photo-acid generator (B-1-1) (5.0 parts by mass), and the copolymer P-4 (2.0 parts by mass) were dissolved in methyl ethyl ketone (300 parts by mass) to prepare a binder layer forming solution. The prepared binder layer forming solution was spin-coated on a washed glass substrate, and irradiated with 500 mJ/cm$^2$ of ultraviolet rays using a 365 nm UV-LED at room temperature. Then, a binder layer was produced by annealing at 120° C. for 1 minute. The film thickness was about 3 μm. The surface energy of the binder layer was 50 mN/m.

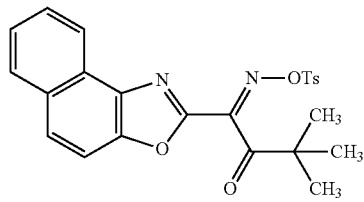

B-1-1

[Irradiation Step (Impartation of Alignment Function)]

The obtained binder layer was irradiated with 25 mJ/cm$^2$ of UV light (ultra-high pressure mercury lamp; UL750; manufactured by HOYA CANDEO OPTRONICS CORPORATION) (wavelength: 313 nm) passing through a wire grid polarizer at room temperature to impart an alignment function (regulating force).

[Formation of Optically Anisotropic Layer (Upper Layer)]

A commercially available liquid crystal compound (ZLI-4792, manufactured by Merck KGaA) (100 parts by mass), a photopolymerization initiator (IRGACURE 907, manufactured by BASF SE) (3 parts by mass), a sensitizer (KAYA-CURE DETX, manufactured by Nippon Kayaku Co., Ltd.) (1 part by mass), and the following horizontal alignment agent (0.3 parts by mass) were dissolved in methyl ethyl ketone (193 parts by mass) to prepare an optically anisotropic layer forming solution.

The above-described optically anisotropic layer forming solution was applied to the binder layer having the alignment function (regulating force) imparted thereto by a wire bar coater #2.2, and heated for 2 minutes at 60° C., and at the temperature maintained at 60° C., irradiation with 300 mJ/cm$^2$ of ultraviolet rays was performed thereon using a 160 W/cm air-cooled metal halide lamp (manufactured by Eye Graphics Co., Ltd.) while nitrogen purge was conducted to make an atmosphere with an oxygen concentration of 1.0 vol % or less. Thus, an optically anisotropic layer was formed, and an optical laminate was produced.

Horizontal Alignment Agent

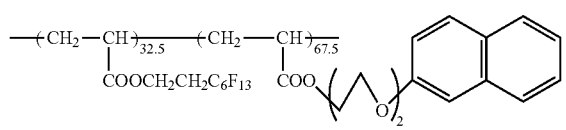

Example 2-2

An optical laminate was produced in the same manner as in Example 2-1, except that the copolymer P-9 was used instead of the copolymer P-4.

Example 2-3

An optical laminate was produced in the same manner as in Example 2-2, except that 50 parts by mass of the following liquid crystal compound L-3 and 50 parts by mass of the following liquid crystal compound L-4 were used instead of the rod-like liquid crystal compound.

The group adjacent to the acryloyloxy group of the following liquid crystal compounds L-3 and L-4 represents a propylene group (group in which a methyl group was substituted with an ethylene group). Each of the following liquid crystal compounds L-3 and L-4 represents a mixture of regioisomers with different methyl group positions.

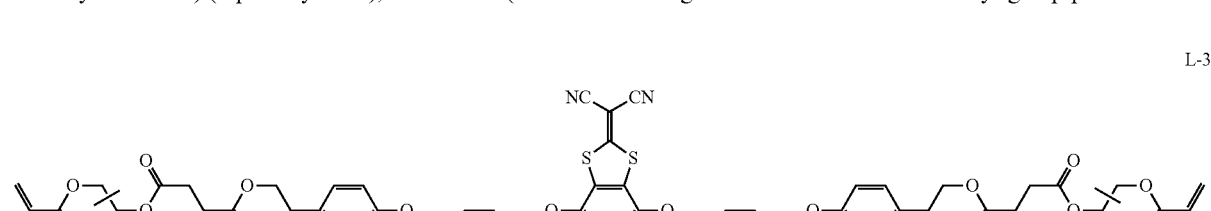

L-3

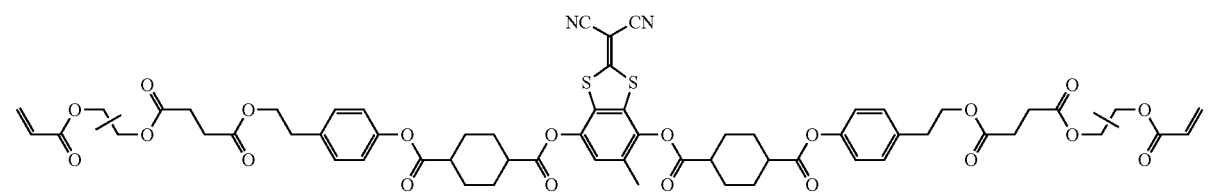

L-4

Example 2-4

An optical laminate was produced in the same manner as in Example 2-2, except that 50 parts by mass of the following liquid crystal compound L-5 and 50 parts by mass of the following liquid crystal compound L-6 were used instead of the rod-like liquid crystal compound.

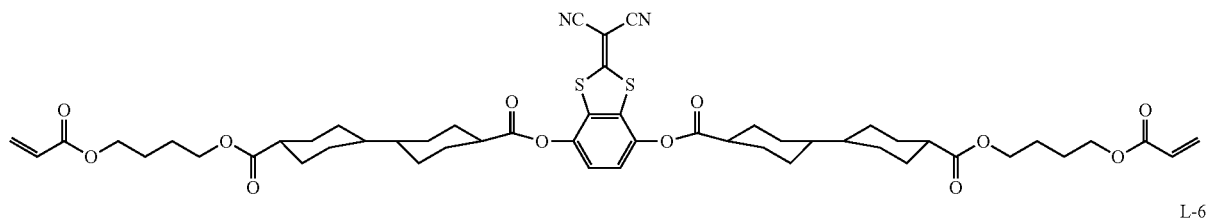

L-5

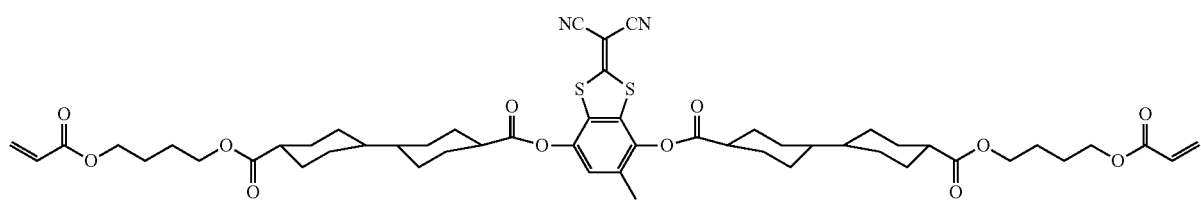

L-6

Example 2-5

An optical laminate was produced in the same manner as in Example 2-2, except that the following liquid crystal compound L-7 was used instead of the rod-like liquid crystal compound.

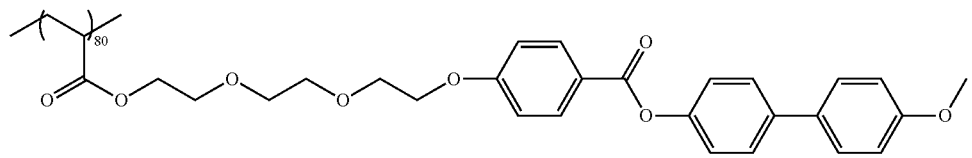

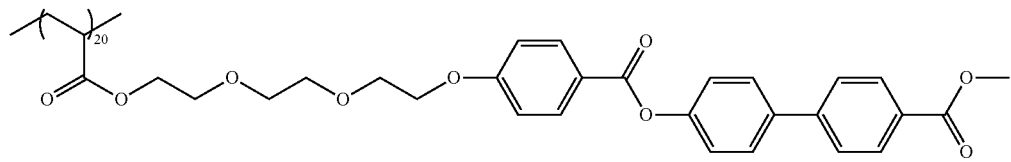

L-7

Example 2-6

An optical laminate was produced in the same manner as in Example 2-3, except that the copolymer P-11 was used instead of the copolymer P-9, the following liquid crystal compounds L-1 and L-2 were used instead of the acrylic monomer (PETA, manufactured by OSAKA ORGANIC CHEMICAL INDUSTRY LTD.), and the following vertical alignment agents S-1 (1.0 part by mass) and S-2 (1.0 part by mass) were added.

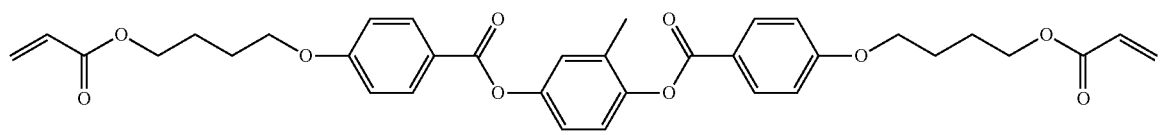

L-1

-continued

L-2
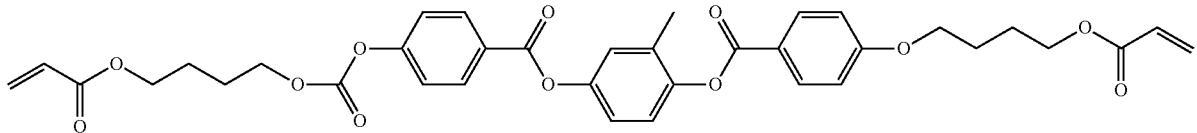

S-1
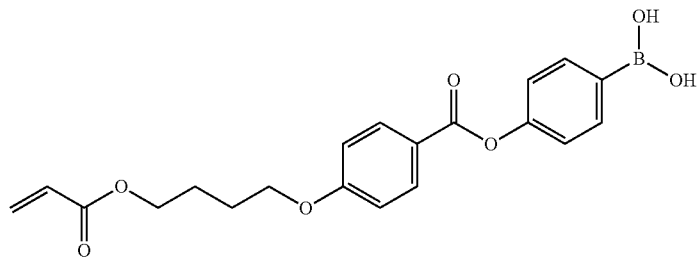

S-2
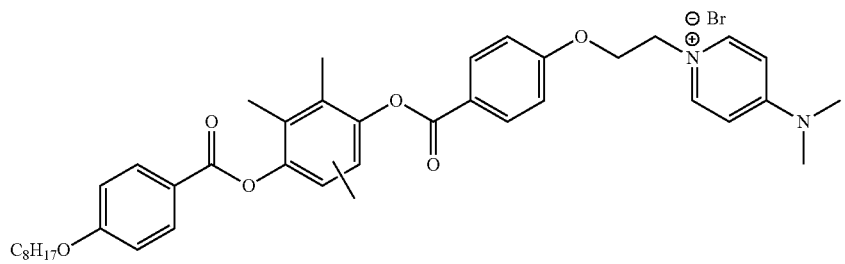

Example 2-7

An optical laminate was produced in the same manner as in Example 2-3, except that the copolymer P-11 was used instead of the copolymer P-9, the following liquid crystal compounds L-8 (83 parts by mass), L-9 (15 parts by mass), and L-10 (2 parts by mass) were used instead of the acrylic monomer (PETA, manufactured by OSAKA ORGANIC CHEMICAL INDUSTRY LTD.), and the above-described vertical alignment agents S-1 (1.0 part by mass) and S-2 (1.0 part by mass) were added.

L-8
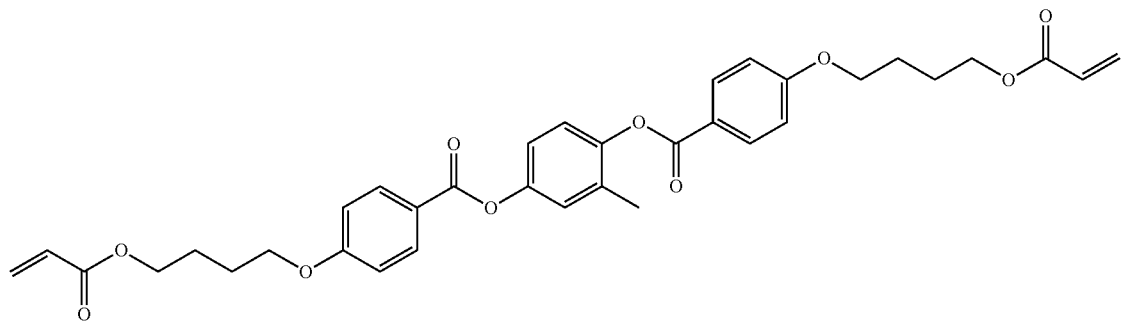

L-9
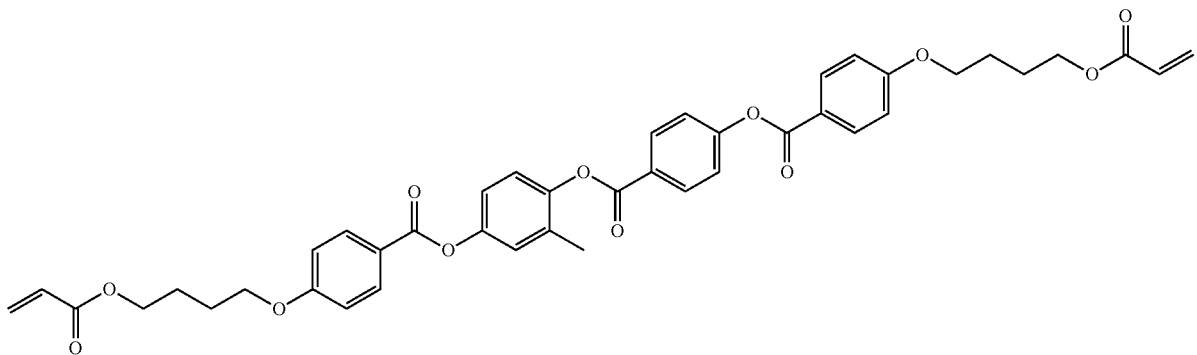

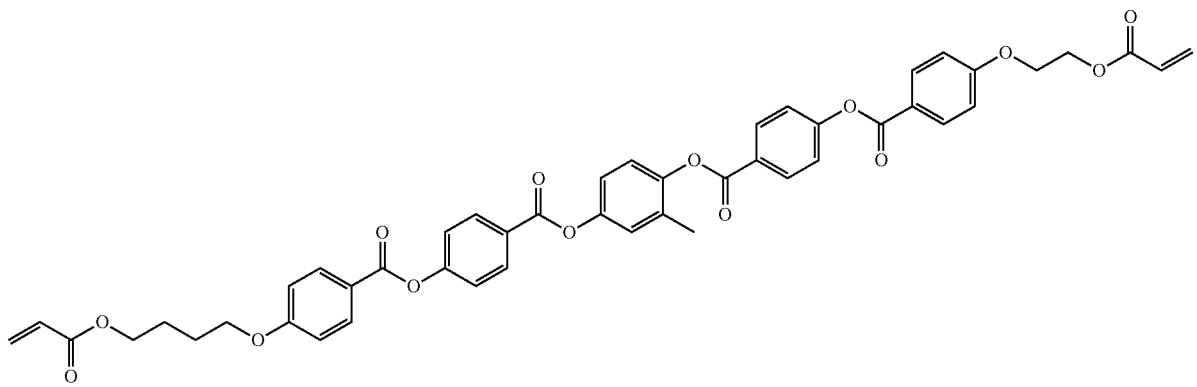

L-10

[Wind Unevenness]

Two polarizing plates were installed in crossed nicols, a sample of a binder layer produced was installed therebetween, and the presence or absence of streak-like unevenness was observed to evaluate wind unevenness according to the following criteria. The results are shown in the following Table 2.

<Evaluation Criteria>
A: No unevenness is visible.
B: Unevenness is almost invisible.
C: Unevenness is visible.

[Upper Layer Coatability]

The surface energy of the produced binder layer was measured, and the upper layer coatability was evaluated based on the following criteria. The results are shown in the following Table 2.

<Evaluation Criteria>
A: 45 mN/m or greater
B: 40 mN/m or greater and less than 45 mN/m
C: 30 mN/m or greater and less than 40 mN/m
D: less than 30 mN/m

[Liquid Crystal Aligning Properties]

Two polarizing plates were installed in crossed nicols, a sample obtained by laminating a binder layer and an optically anisotropic layer was installed therebetween, and the degree of light leakage was observed for evaluation according to the following criteria. The results are shown in the following Table 2.

<Evaluation Criteria>
A: There is no light leakage.
B: There is almost no light leakage.
C: Light leak is observed.

TABLE 2

| | Binder Layer | | | | | | |
| | Copolymer | | | | | | Liquid |
| | Type | Content (parts by mass) | Binder | Optically Anisotropic Layer | Wind Unevenness | Upper Layer Coatability | Crystal Aligning Properties |
|---|---|---|---|---|---|---|---|
| Example 2-1 | P-4 | 2 | PETA | Liquid Crystal Compound (ZLI-4792) | A | A | B |
| Example 2-2 | P-9 | 2 | PETA | Liquid Crystal Compound (ZLI-4792) | A | A | A |
| Example 2-3 | P-9 | 2 | PETA | Liquid Crystal Compound L-3 Liquid Crystal Compound L-4 | A | A | A |
| Example 2-4 | P-9 | 2 | PETA | Liquid Crystal Compound L-5 Liquid Crystal Compound L-6 | A | A | A |
| Example 2-5 | P-9 | 2 | PETA | Liquid Crystal Compound L-7 | A | A | A |
| Example 2-6 | P-11 | 2 | Liquid Crystal Compound L-1 Liquid Crystal Compound L-2 | Liquid Crystal Compound L-3 Liquid Crystal Compound L-4 | A | B | A |
| Example 2-7 | P-11 | 2 | Liquid Crystal Compound L-8 Liquid Crystal Compound L-9 Liquid Crystal Compound L-10 | Liquid Crystal Compound L-3 Liquid Crystal Compound L-4 | A | B | A |
| Comparative Example 2-1 | H-1 | 2 | PETA | Liquid Crystal Compound (ZLI-4792) | C | C | A |

From the results shown in Tables 1 and 2, it has been found that in a case where a copolymer having no repeating unit C was used, the wind unevenness during the formation of the binder layer and the upper layer coatability of the formed binder layer are poor (Comparative Example 2-1).

In contrast, it has been found that in a case where a copolymer having the repeating unit C including, on a side chain, a cleaving group which decomposes by the action of light or the like to produce a polar group is used, wind unevenness during the formation of the binder layer can be suppressed, and the coatability of the formed binder layer to the upper layer coating liquid and the liquid crystal aligning properties are improved (Examples 2-1 to 2-7).

What is claimed is:

1. A photo-alignment copolymer comprising:
a repeating unit A including a photo-alignment group, wherein the repeating unit A is a repeating unit represented by Formula (A),

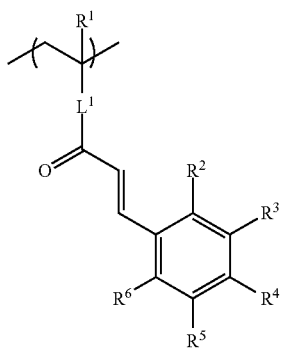

(A)

in Formula (A), $R^1$ represents a hydrogen atom or a methyl group, and $R^2$, $R^3$, $R^4$, $R^5$, and $R^6$ each independently represent a hydrogen atom or a substituent, and among $R^2$, $R^3$, $R^4$, $R^5$, and $R^6$, two adjacent groups may be bonded to form a ring, $L^1$ in Formula (A) is a divalent linking group represented by any one of Formula (1), . . . , or Formula (10),

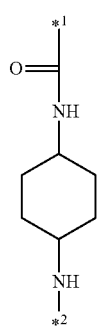

(1)

-continued

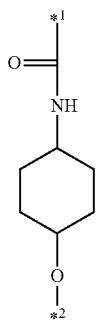

(2)

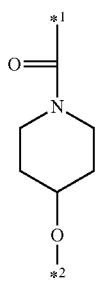

(3)

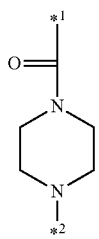

(4)

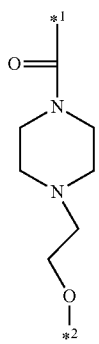

(5)

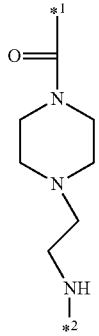

(6)

-continued (7)
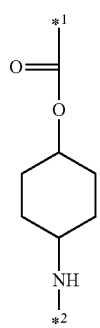

(8)
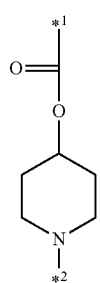

(9)
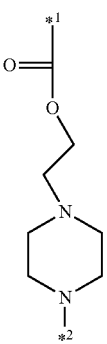

(10)
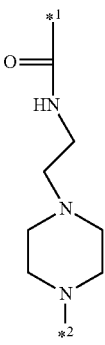

in Formulae (1) to (10), *1 represents a bonding position with a carbon atom constituting a main chain in Formula (A), and *2 represents a bonding position with a carbon atom constituting a carbonyl group in Formula (A);
a repeating unit B including a crosslinkable group which causes a crosslinking reaction by the action of at least one selected from the group consisting of light, heat, an acid, and a base; and
a repeating unit C including a cleaving group which decomposes by the action of at least one selected from the group consisting of light, heat, an acid, and a base to produce a polar group, wherein the repeating unit C has the cleaving group on a side chain, and has a fluorine atom or a silicon atom on a side closer to a terminal than the cleaving group on the side chain, and
a content of each of the repeating units with respect to a total of a content a of the repeating unit A, a content b of the repeating unit B, and a content c of the repeating unit C satisfies Expressions (W1) to (W3) by mass ratio, $$0.03 \le a/(a+b+c) \le 0.75 \quad (W1)$$

$$0.20 \le b/(a+b+c) \le 0.90 \quad (W2)$$

$$0.03 \le c/(a+b+c) \le 0.70 \quad (W3).$$

2. The photo-alignment copolymer according to claim 1, wherein the content of each of the repeating units with respect to the total of the content a of the repeating unit A, the content b of the repeating unit B, and the content c of the repeating unit C satisfies Expressions (W4) to (W6) by mass ratio $$0.03 \le a/(a+b+c) \le 0.45 \quad (W4)$$

$$0.45 \le b/(a+b+c) \le 0.90 \quad (W5)$$

$$0.03 \le c/(a+b+c) \le 0.50 \quad (W6).$$

3. The photo-alignment copolymer according to claim 1, wherein the content of each of the repeating units with respect to the total of the content a of the repeating unit A, the content b of the repeating unit B, and the content c of the repeating unit C satisfies Expressions (W7) to (W9) by mass ratio $$0.03 \le a/(a+b+c) \le 0.40 \quad (W7)$$

$$0.55 \le b/(a+b+c) \le 0.90 \quad (W8)$$

$$0.03 \le c/(a+b+c) \le 0.40 \quad (W9).$$

4. The photo-alignment copolymer according to claim 1, wherein the content of each of the repeating units with respect to the total of the content a of the repeating unit A, the content b of the repeating unit B, and the content c of the repeating unit C satisfies Expressions (W10) to (W12) by mass ratio $$0.03 \le a/(a+b+c) \le 0.20 \quad (W10)$$

$$0.60 \le b/(a+b+c) \le 0.80 \quad (W11)$$

$$0.15 \le c/(a+b+c) \le 0.35 \quad (W12).$$

5. The photo-alignment copolymer according to claim 1, wherein the repeating unit C is a repeating unit represented by Formula (C1) or a repeating unit represented by Formula (C2-1) or (C2-2), (C1)
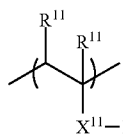

(C2-1)
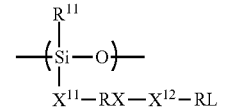

-continued (C2-2)

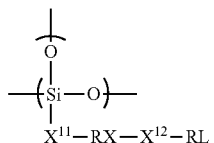

in Formulae (C1) and (C2-1), $R^{11}$ represents a hydrogen atom or an alkyl group having 1 to 3 carbon atoms, and a plurality of $R^{11}$'s in Formula (C1) may be the same as or different from each other, and in Formulae (C1), (C2-1), and (C2-2), $X^{11}$ and $X^{12}$ each independently represent a single bond or a divalent linking group, RK represents the cleaving group, and RL represents a monovalent organic group containing a fluorine atom or a silicon atom.

6. The photo-alignment copolymer according to claim 5, wherein RK in Formulae (C1), (C2-1), and (C2-2) is a cleaving group represented by any one of Formula (rk-1), ..., or Formula (rk-13), (rk-1)
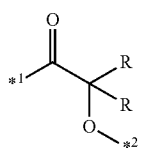

(rk-2)
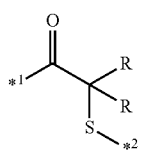

(rk-3)
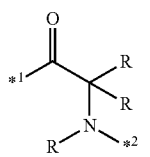

(rk-4)
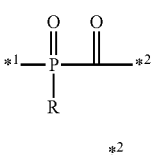

(rk-5)
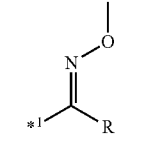

(rk-6)
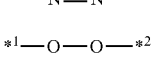

(rk-7)
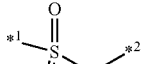

(rk-8)
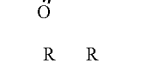

(rk-9)
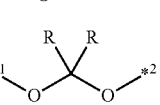

(rk-10)
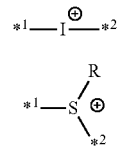

(rk-11)
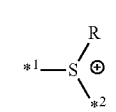

(rk-12)
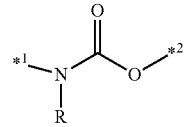

(rk-13)
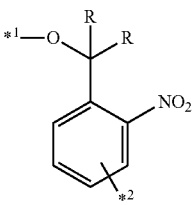

in Formulae (rk-1) to (rk-13), *1 represents a bonding position with any one of $X^{11}$ or $X^{12}$ in Formulae (C1), (C2-1), and (C2-2), *2 represents a bonding position with either $X^{11}$ or $X^{12}$ in Formulae (C1), (C2-1); and (C2-2) not bonded with *1, and R's each independently represent a hydrogen atom or a monovalent organic group.

7. The photo-alignment copolymer according to claim 1, wherein $R^4$ in Formula (A) is an alkoxy group having 6 to 16 carbon atoms.

8. The photo-alignment copolymer according to claim 1, wherein the substituents represented by $R^2$, $R^3$, $R^4$, $R^5$, and $R^6$ in Formula (A) each independently represent a halogen atom, a linear, branched, or cyclic alkyl group having 1 to 20 carbon atoms, a linear halogenated alkyl group having 1 to 20 carbon atoms, an alkoxy group having 1 to 20 carbon atoms, an aryl group having 6 to 20 carbon atoms, an aryloxy group having 6 to 20 carbon atoms, a cyano group, an amino group, or a group represented by Formula (11),

(11)
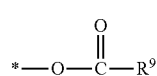

in Formula (11), * represents a bonding position with a benzene ring in Formula (A), and $R^9$ represents a monovalent organic group.

9. The photo-alignment copolymer according to claim 1, wherein the repeating unit B is a repeating unit represented by Formula (B), (B)
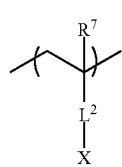

in Formula (B), R⁷ represents a hydrogen atom or a methyl group, L² represents a divalent linking group, and X represents the crosslinkable group.

10. The photo-alignment copolymer according to claim 9, wherein X in Formula (B) is at least one crosslinkable group selected from the group consisting of Formulae (X1) to (X4),

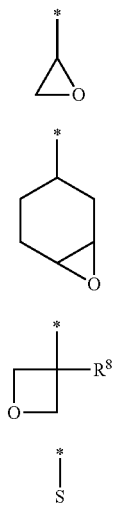

(X1)

(X2)

(X3)

(X4)

in Formulae (X1) to (X4), * represents a bonding position with L² in Formula (B), R⁸ represents any one of a hydrogen atom, a methyl group, or an ethyl group, and S in Formula (X4) represents a functional group having an ethylenically unsaturated double bond.

11. The photo-alignment copolymer according to claim 10,
wherein the repeating unit B includes a repeating unit in which X in Formula (B) is a crosslinkable group represented by any one of Formula (X1), Formula (X2), or Formula (X3) and a repeating unit in which X in Formula (B) is a crosslinkable group represented by Formula (X4).

12. The photo-alignment copolymer according to claim 9, wherein L² in Formula (B) is a divalent linking group formed by combining at least two selected from the group consisting of a linear, branched, or cyclic alkylene group having 1 to 18 carbon atoms which may have a substituent, an arylene group having 6 to 12 carbon atoms which may have a substituent, an ether group, a carbonyl group, and an imino group which may have a substituent.

13. The photo-alignment copolymer according to claim 1, wherein a weight-average molecular weight is 10,000 to 500,000.

14. A binder composition comprising:
a binder; and
the photo-alignment copolymer according to claim 1.

15. A binder layer which is formed of the binder composition according to claim 14.

16. An optical laminate comprising:
the binder layer according to claim 15; and
an optically anisotropic layer which is provided on the binder layer,
wherein the optically anisotropic layer is formed of a polymerizable liquid crystal composition containing a polymerizable liquid crystal compound, and
the binder layer and the optically anisotropic layer are laminated adjacent to each other.

17. An image display device comprising:
the optical laminate according to claim 16.

* * * * *